United States Patent
Yasuda

(10) Patent No.: US 6,330,526 B1
(45) Date of Patent: Dec. 11, 2001

(54) CHARACTERISTIC VARIATION EVALUATION METHOD OF SEMICONDUCTOR DEVICE

(75) Inventor: Takeshi Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/266,915

(22) Filed: Mar. 12, 1999

(30) Foreign Application Priority Data

Sep. 30, 1998 (JP) .................................................. 10-277415

(51) Int. Cl.[7] .............................. G06F 7/60; G06F 17/10
(52) U.S. Cl. .................................................................. 703/2
(58) Field of Search ..................................................... 703/2

(56) References Cited

U.S. PATENT DOCUMENTS 5,835,891 * 11/1998 Stoneking ............................. 702/117

OTHER PUBLICATIONS

Welton et al.; "Statistical worst–case simulation for CMOS technology"; IEE Coll. Improving the Effiiency of IC Manufact. Tech.; pp. 4/1–4/3, 1995.*

Burke et al.; "Worst–case MOSFET parameter extraction for a 2 (mu–m) CMOS process"; IEEE ICMTS 1994; pp. 119–125, Mar. 1994.*

Farshid Iravani, et al. "Statistical Modeling Tools, Methods and Applications for Integrated Circuit Manufacturability" Proc. IEEE Int. Conference On Microelectronic Test Structures, vol. 8, Mar. 1995, pp. 203–207.

James A. Power, et al. "Relating Statistical MOSFET Model Parameter Variabilities to IC Manufacturing Process Fluctuations Enabling Realistic Worst Case Design" IEEE Transactions On Semiconductor Manufacturing, vol. 7, No. 3, Aug. 1994, pp. 306–318.

J. A. Power, et al. "MOSFET Statistical Parameter Extraction Using Multivariate Statistics" Proc. IEEE Int. Conference On Microelectronic Test Structures, vol. 4, No. 1, Mar. 1991, pp. 209–214.

Michael Bolt, et al. "Realistic Statistical Worst–Case Simulations of VLSI Circuits" IEEE Transactions on Semiconductor Manufacturing, vol. 4, No. 3, Aug. 1991, pp. 193–198.

T. Yasuda, et al. "A Determination Method of Worst Case MOSFET Model Parameter Using Multivariate Analysis" IEEE 1997 $2^{ND}$ International Workshop on Statistical Metrology, Jun. 1997, pp. 12–15.

Takeshi Yasuda, et al. "A Determination Technique of Worst Case MOSFET Model Parameter Using Multivariate Analysis" Technical Report of IEICE, Nov. 1996, pp. 27–34 (with English Abstract).

* cited by examiner

Primary Examiner—Kevin J. Teska
Assistant Examiner—Hugh Jones
(74) Attorney, Agent, or Firm—Oblon, Spivak, McClelland, Maier & Neustadt, P.C.

(57) ABSTRACT

Specific parameters used for calculation of a worst-case parameter can be readily selected. Parameters not suitable for characteristic-value expression are eliminated from principal parameters (step ST31), and model equations are extracted (step ST32). Then, parameter values extracted from the same chip are inserted into the model equations to calculate the characteristic value (step ST32). A correlation coefficient between the calculated and measured characteristic values are obtained (step ST33) to select specific parameters (step ST34).

7 Claims, 16 Drawing Sheets

DELAY TIME OF INVERTER CHAIN

FIG. 18A
BACKGROUND ART
Short
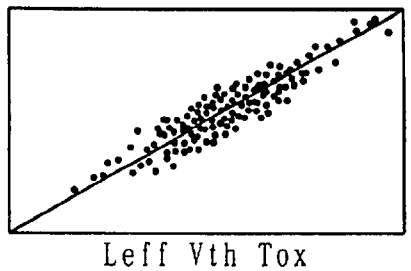
MEASURED VALUE (Idmax)
Leff Vth Tox
FIG. 18B
BACKGROUND ART
Large
Tox
FIG. 18C
BACKGROUND ART
Small
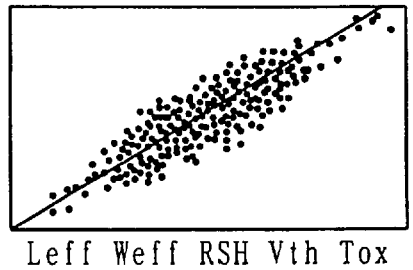
MEASURED VALUE (Idmax)
Leff Weff RSH Vth Tox
FIG. 18D
BACKGROUND ART
Nallow
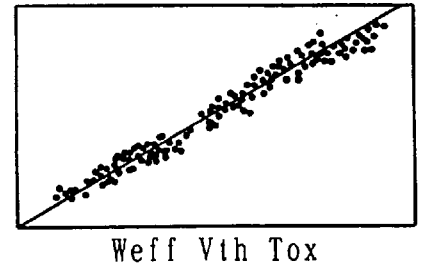
Weff Vth Tox
FIG. 19
BACKGROUND ART
CORRELATION COEFFICIENT = 0.958
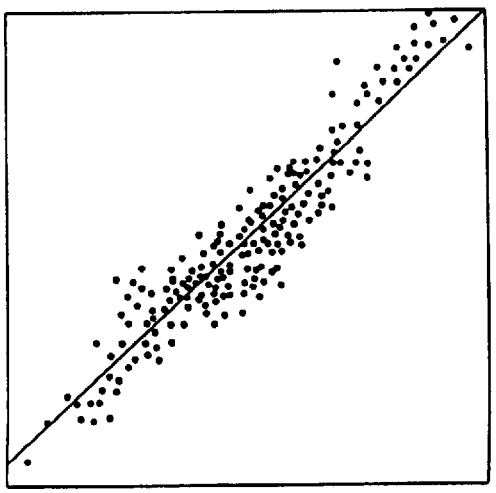
MEASERED Idmax
Idmax OF LINEAR MODEL

CORRELATION COEFFICIENT = 0.896

CORRELATION COEFFICIENT = 0.940

CHARACTERISTIC VARIATION EVALUATION METHOD OF SEMICONDUCTOR DEVICE

BACKGROUND OF THE INVENTION

1. Field of the Invention

The present invention relates to a characteristic variation evaluation method for generating a worst-case parameter to evaluate characteristic variations of semiconductor devices; a characteristic variation evaluation unit; and a recording medium for storing a characteristic variation evaluation program, all of semiconductor devices.

2. Description of the Background Art

Fluctuations in semiconductor process conditions stochastically cause circuit performance variations. Such variations have been relatively widened with the shrinking of minimum device size, so that it is getting necessary to estimate performance variations, along with standard performance, in the device development phase.

For instance, there are a method for detecting independent model parameters by a factor analysis or a principal component analysis in order to represent variations of every parameter by the model parameters; and a method for classifying parameters into groups with consideration for their correlation and analyzing sensitivity of each classified group to circuit performance in order to represent circuit performance variations by the sensitivity and the parameter variations.

These methods are both intended to represent variations of characteristic values by the parameter variations, but the use of simulations therein costs much labor. Hence, Technical Report SDM96-122 (1996-11) of the Institute of Electronics, Information and Communication Engineers, for example, provides a method for representing performance variations of basic circuits due to fluctuations in process conditions by circuit model parameters which are obtained by a principal component analysis and a multiple regression analysis, and determining parameters having the highest probability of being the worst case under a certain condition of circuit performance, as parameters representing the worst case (this method is hereinafter referred to as "basic method.")

The features of this conventional basic method are as follows:

(1) To determine parameter values corresponding to the worst case with consideration for a correlation between parameters;

(2) To increase accuracy in probability estimation as compared with a method using corner models;

(3) To determine parameter values by specifying values corresponding to the worst case of circuit performance; and (4) To reduce the required number of simulations for parameter verification.

Outline of Basic Method

A general flow of the basic method is shown in FIG. 13. First, performance (drain current, circuit delay etc.) of a large number of chips is measured, and a small number of principal parameters (effective channel length, threshold voltage etc.) of model parameters in circuit simulation are extracted from a plurality of chips (step ST1). After eliminating outliers (step ST2), each parameter is applied to distribution (step ST3). Then, a typical chip (typical semiconductor device) giving a standard performance is selected (step ST4) and its principal parameters are extracted as typical parameters (step ST5). At the same time, parameters necessary to represent variations of a characteristic value in the worst case are selected by a partial regression analysis (step ST6) and a multiple regression analysis (step ST7). By adapting the basic method to those selected parameters, a parameter value corresponding to the worst case (worst-case parameter) is determined (step ST8). Finally, the parameters representing the variations of the characteristic value, out of the typical parameters extracted from the typical chip, are replaced by the worst-case parameter to conduct simulation and verification of the worst-case parameter (step ST9).

We will give a further detailed description of each step on the flow chart in FIG. 13. First, parameter extraction at step ST1 is described. The parameters to be extracted at step ST1 are, for example, effective channel length Leff; effective channel width Weff; external resistance RSH; oxide film thickness Tox; threshold voltage Vth; junction capacitance of plane components Cj; and junction capacitance of line components Cjsw. Of the model parameters in circuit simulation, the above parameters are considered as principal parameters having physical connotations and influence on circuit performance such as circuit delay Tpd and drain current Idmax.

Next, outlier elimination at step ST2 is described. At step ST2, parameter sets of chips at least having one outlier are eliminated from the principal parameters in circuit simulation extracted from a plurality of chips. Under present circumstances, there are a method for converting data of each parameter including outliers into an independent variable by a principal component analysis and eliminating outliers until no correlation is found in data of converted variables; and a method for eliminating outliers by referring to conversion and distribution of each parameter.

The former method by the principal component analysis is, for example, shown in FIGS. 14 and 15. The vertical axis denotes a second principal component and the horizontal axis denotes a first principal component. In FIG. 14, those principal components are correlated because of outliers mixed therein. By eliminating the outliers, a distribution of plots is rounded as shown in FIG. 15, in which the principal components are uncorrected. Such operation is performed on certain principal components for each parameter to eliminate outliers.

Next, application to distribution at step ST3 is described. At step ST3, characteristic values and parameters are applied to suitable probability distribution. Assuming in general that a random variable influenced by various non-specific factors approximately has a normal distribution, a characteristic value is applied to normal distribution and parameters are applied to multivariate normal distribution. FIG. 16 shows a characteristic value and principal parameters applied to normal distribution. As shown, the parameters and the characteristic value almost have a normal distribution, and there is a correlation between the parameters as shown in FIG. 17.

Next, chip selection for typical parameter selection at step ST4 is described. First, alternatives are narrowed down to chips whose characteristic values are about average in distribution. As necessary, the principal parameters may also be used to narrow down the alternatives. Then, a chip whose principal model parameters have the highest probability density is selected as a typical chip from which all model parameters with typical values in circuit simulation are extracted. At step ST5, predetermined parameters (Leff, Vth etc.) of the typical chip (semiconductor device) are extracted as typical parameters.

Next, parameter selection by the partial regression analysis at step ST6 is described. At step ST6, it is checked whether one certain parameter which is considered to contribute to the variations of the characteristic value includes a component other than the components representing the characteristic value. That is, the partial regression analysis reveals a contribution of a certain parameter to the characteristic values.

Next, multiple regression analysis at step ST7 is described by which a contribution of a parameter set to the characteristic value is confirmed. At step ST7, the degree of correlation between measured values and values of linear regression equations calculated from the parameter set selected by the partial regression analysis, is checked. This analysis confirms to what degree the selected parameters can represent the variations of the characteristic value.

Next, a method for determining the worst-case MOSFET model parameter at step ST8 is described. A variable characteristic value p (circuit delay time, current driving capability etc.) is considered as a random variable having a certain probability distribution. Using a model parameter x in circuit simulation having a large contribution to variations of the characteristic value p, the variations of the characteristic value p are generally expressed as p=F(x)+e, where p is the random variable vector of the characteristic value; x is the random variable vector of the parameter; and e is the error vector. In the present specification, a constant is also included in the concepts of vectors as a vector with one element, so the description in the case of a constant will be omitted.

FIGS. 18A to 18D show that current driving capability Idmax as the characteristic value p can be well represented by the effective channel length Leff, the effective channel width Weff, the external resistance RSH, the oxide film thickness Tox, and the threshold voltage Vth. FIG. 18A shows a correlation between the parameters Leff, Vth, Tox and the characteristic value Idmax; FIG. 18B shows a correlation between the parameter Tox and the characteristic value Idmax; FIG. 18C shows a correlation between the parameters Leff, Weff, RSH, Vth, Tox and the characteristic value Idmax; and FIG. 18D shows a correlation between the parameters Weff, Vth, Tox and the characteristic value Idmax. Assuming that the variations of the characteristic value are considerably small, the characteristic value p can be expressed by a linear combination as follows:

$$p=\beta^t x+\beta_0+e \quad (1)$$

where $\beta$ is the partial regression coefficient vector or matrix in the multiple regression analysis; and t is the transposition symbol.

FIG. 19 shows that the current driving capability Idmax as the characteristic value p can be well represented by a linear combination of the effective channel length Leff, the effective channel width Weff, the external resistance RSH, the oxide film thickness Tox, and the threshold voltage Vth. Suppose that the model parameters in circuit simulation which can well represent the variations of the characteristic value have a certain multidimensional distribution. For example, multivariate normal distribution of $x \approx N(\mu_x, \Sigma_x)$ is assumed in this case. Then, the probability density function can be expressed as:

$$f(x) = \frac{1}{\sqrt{(2\pi)^n |\Sigma_x|}} \cdot \exp\left\{-\frac{1}{2}(x-\mu_x)^t \Sigma_x^{-1}(x-\mu_x)\right\}$$

where $\mu_x$ is the mean vector of x; and $\Sigma_x$ is the variance-covariance matrix of x.

Since there is a correlation between the parameters as previously described, the parameters are applied to multivariate normal distribution which can consider a linear correlation between the parameters. In general, a linear combination of random variables having a normal distribution shows a normal distribution, so $p \approx N(\mu_p, \Sigma_p)$. By applying a suitable normal direct matrix A to x, Z can have an independent normal distribution:

$$Z=A^t X \quad (2)$$

From Equation (1), the characteristic value p can be expressed by a linear combination of Z:

$$C=b^t Z+b_0+e \quad (3)$$

Further, the probability density function of Z is given by:

$$f(z) = \frac{1}{\sqrt{(2\pi)^n |\Sigma_z|}} \cdot \exp\{-(z-\mu_z)^t \Sigma_z^{-1}(z-\mu_z)\} \quad (4)$$

where
$\Sigma_z = A^t \Sigma_x A/2$;
$\Sigma_z$ is the diagonal matrix.

Ignoring the error term e, consider C as a constant value corresponding to the worst/best-case characteristic value. Then, Equation (3) can be considered as an equation restricted on Z:

$$b^t \cdot Z = C - b_O \quad (5)$$

The principle component Z that satisfies Equation (5) and maximizes the logarithmic probability density function of Equation (4), is given by:

$$z=\mu_x+(\Sigma_z \cdot b)^{-1} \cdot (p-\mu_p) \quad (6)$$

where
$\mu_p=(b^t \cdot \mu_z+b_0)$: mean vector of the characteristic value.

Further, from Equation (2), a worst-case parameter $x_w$ can be expressed as:

$$x_w=\mu_x+(\Sigma_x \cdot B) \cdot (B^t \cdot \Sigma_x B)^{-1} \cdot (p-\mu_p) \quad (7)$$

where $$B=(Ab) \quad (8)$$

If a characteristic value with desired yield is inserted into Equation (7), model parameters in circuit simulation corresponding to the worst/best-case characteristic value can be uniquely obtained.

Next, verification results of the worst-case parameter at step ST9 is described. In a 0.35-$\mu$m CMOS process, verification of the basic method is conducted. To obtain parameters, firstly with a delay time Tpd of an inverter chain as a characteristic value, the basis method is applied to the current driving capabilities Idmax, the junction capacitances of plane components Cj, and the junction capacitances of line components Cjsw of both N- and P-channels, to obtain respective worst/best-case values. Secondly with the current driving capabilities Idmax as a characteristic value, the other parameter values are obtained.

According to the partial regression analysis with the current driving capabilities Idmax, the junction capacitances of plane components Cj, and the junction capacitances of line components Cjsw of both NMOS and PMOS transistors as a parameter set and the basic circuit as a characteristic value, it is found that the partial regression coefficient of the junction capacitance Cj of the PMOS transistor is considerably low. That junction capacitance Cj is, however, left as one of parameters representing the worst/best case in order to maintain a balance of parameters between the channels. As a result, the junction capacitance Cj of the PMOS transistor becomes about a mean value.

FIG. 20 shows the results of the multiple regression analysis with the delay time Tpd of an inverter chain as a characteristic value and the current driving capabilities Idmax, the junction capacitances of plane components Cj, the junction capacitances of line components Cjsw of both N- and P-channels as explanatory variables.

The analysis shows that in the basic circuit, the inverter chain has a correlation coefficient of 0.90 and the other circuits have a correlation coefficient of 0.87 or more. This indicates that the variations in the basic circuit can be expressed in a linear form of the current driving capabilities Idmax, the junction capacitances of plane components Cj, and the junction capacitances of line components Cjsw of both N- and P-channels.

Next, the partial regression analysis is conducted with the effective channel length Leff, the effective channel width Weff, the oxide film thickness Tox, the external resistance RSH, and the threshold voltage Vth as a parameter set, and the current driving capabilities Idmax of both NMOS and PMOS transistors, Leff of 0.35, and Weff of 10 $\mu$m as a characteristic value.

The effective channel width Weff is excluded from the parameters representing the worst/best case because of its considerably low partial regression coefficient. The oxide film thickness Tox is also excluded because of its small variations and its correlation with the threshold voltage Vth. The other parameters have a high partial regression coefficient with respect to the current driving capability Idmax.

FIG. 21 shows the results of the multiple regression analysis with the current driving capability Idmax of the NMOS transistor as a characteristic value and the effective channel length Leff, the external resistance RSH, and the threshold voltage Vth as explanatory variables. Based on the above result, in both NMOS and PMOS transistors, the effective channel length Leff, the external resistance RSH, and the threshold voltage Vth are used as parameters representing the worst/best-case current driving capability Idmax.

FIG. 22 shows a comparison between measured values and simulated values of the worst/best-case current driving capability Idmax ($-3\sigma$, $-2\sigma$, $-\sigma$, $\sigma$, $2\sigma$, $3\sigma$). The simulations are performed by using the parameter value calculated by the basic method. In both NMOS and PMOS transistors, the effective channel length Leff, the external resistance RSH, the threshold voltage Vth, the junction capacitance of plane components Cj, and the junction capacitance of line components Cjsw are used as parameters representing the worst/best-case circuit performance. The other parameters are typical parameters extracted at step ST5. FIG. 23 shows errors of variations between measured values and simulated values of the basic circuit. The variations of the simulated values obtained from the above parameters almost agree with the variations of the measured values.

To make the conventional problems easy to understand, we will recapitulate step ST8 of calculating the worst-case parameter after step ST10 in FIG. 13. Step ST8 roughly includes: step ST11 of calculating sensitivity; and step ST12 of calculating the worst-case parameter as shown in FIG. 24. In the foregoing description, sensitivity B is obtained by the principal component analysis and the worst-case parameter $x_w$ is obtained from Equation (7). Alternatively, the sensitivity can be calculated as follows: First, a product unit having standard characteristics is determined by the parameter x and the characteristic value p, and parameters representing the characteristics of the product unit are extracted by a structural formula showing product characteristics. Then, sensitivity of these parameters to the characteristic value is analyzed to calculate a partial differential coefficient $B[\partial pi/\partial xj]$ (i=1, 2, ..., k, j=1, 2, ..., n).

The parameters used for the generation of the worst-case parameter at step ST8 is empirically selected at step ST10 through the partial regression analysis at step ST6 and the multiple regression analysis at step ST7.

In the aforementioned conventional characteristic variation evaluation method of semiconductor devices, the parameters used for the generation of the worst-case parameter are selected by repeating much trial and error based on experiences. This complicates the procedure for generating the worst-case parameter and consumes much time.

Another problem is that the calculation of sensitivity used for the generation of the worst-case parameter requires the principal component analysis. This complicates calculation.

Another problem is that it is difficult to increase accuracy of the worst-case parameter.

Another problem is that calculation becomes complicated when the number of parameters used for the generation of the worst-case parameter is different from the number of characteristic values.

Another problem is that the calculation of the worst-case parameter is complicated and time consuming.

SUMMARY OF THE INVENTION

A first aspect of the present invention is directed to a characteristic variation evaluation method of semiconductor devices. The method comprises the steps of: (a) extracting predetermined parameters concerning a characteristic value of semiconductor devices and measuring the characteristic value; (b) eliminating outliers from data measured at the step (a); (c) selecting a typical semiconductor device having data that is typical among the data with outliers eliminated therefrom, from semiconductor devices used for the measurement of the step (a), and extracting the predetermined parameters of the typical semiconductor device as typical parameters; (d) selecting specific parameters to be used for the generation of a worst-case parameter, from the predetermined parameters; (e) generating a worst-case parameter from the specific parameters on the basis of the data with outliers eliminated therefrom; and (f) verifying a worst-case parameter on the basis of the characteristic value calculated from the typical parameters excepting the specific parameters and the worst-case parameter generated at the step (e). The step (d) includes the steps of: (d-1) obtaining a coefficient concerning the specific parameters; and (d-2) selecting the specific parameters on the basis of the coefficient.

According to a second aspect of the present invention, the step (d-1) of the characteristic variation evaluation method of the first aspect includes the steps of: determining an equation that expresses the characteristic value by some of the predetermined parameters; and obtaining a correlation coefficient between the characteristic value measured at the step (a) and a characteristic value calculated from the equation, as the coefficient.

According to a third aspect of the present invention, the step (d-1) of the characteristic variation evaluation method of the first aspect includes the steps of: obtaining sensitivity from some of the predetermined parameters; and obtaining respective inner products of the sensitivity and those of the predetermined parameters to obtain respective correlation coefficients between the characteristic value measured at the step (a) and the inner products, as the coefficient.

According to a fourth aspect of the present invention, the step (d-1) of the characteristic variation evaluation method of the first aspect includes the steps of: obtaining sensitivity from some of the predetermined parameters; and obtaining respective standard partial regression coefficients of those of the predetermined parameters from the sensitivity, as the coefficient.

According to a fifth aspect of the present invention, the step (d-1) of the characteristic variation evaluation method of the first aspect includes the step of: obtaining respective random coefficients of some of the predetermined parameters, as the coefficient.

A sixth aspect of the present invention is directed to a characteristic variation evaluation method of semiconductor devices. The method comprises the steps of: (a) extracting predetermined parameters concerning a characteristic value of semiconductor devices and at the same time measuring the characteristic value; (b) eliminating outliers from data measured at the step (a); (c) selecting a typical semiconductor device having data that is typical among the data with outliers eliminated therefrom, from semiconductor devices used for the measurement of the step (a), and extracting the predetermined parameters of the typical semiconductor device as typical parameters; (d) selecting specific parameters to be used for the generation of a worst-case parameter from the predetermined parameters; (e) generating a worst-case parameter from the specific parameters on the basis of the data with outliers eliminated therefrom; and (f) verifying a worst-case parameter on the basis of the characteristic value calculated from the typical parameters excepting the specific parameters and the worst-case parameter generated at the step (e). The step (e) includes the steps of: calculating sensitivity, on the basis of the data with outliers eliminated therefrom, from:

$$B=\Sigma_x^{-1}(x-\mu_x)/(p-\mu_p)^t\Sigma_p$$

where B is a sensitivity vector or matrix, x is a parameter vector or matrix, p is a characteristic-value vector or matrix, $\mu_x$ and $\mu_p$ are mean vectors or matrices of x and p, respectively, $\Sigma_x$ and $\Sigma_p$ are variance-covariance matrices of x and p, respectively, −1 indicates an inverse matrix, and t is a transposed matrix; and calculating a worst-case parameter from the sensitivity.

A seventh aspect of the present invention is directed to a characteristic variation evaluation method of semiconductor devices. The method comprises the steps of: (a) extracting predetermined parameters concerning a characteristic value of semiconductor devices and at the same time measuring the characteristic value; (b) eliminating outliers from data measured at the step (a); (c) selecting a typical semiconductor device having data that is typical among the data with outliers eliminated therefrom, from semiconductor devices used for the measurement of the step (a), and extracting the predetermined parameters of the typical semiconductor device as typical parameters; (d) selecting specific parameters to be used for the generation of a worst-case parameter, from the predetermined parameters; (e) generating a worst-case parameter from the specific parameters on the basis of the data with outliers eliminated therefrom; and (f) verifying a worst-case parameter on the basis of the characteristic value calculated from the typical parameters excepting the specific parameters and the worst-case parameter generated at the step (e). The step (e) includes the steps of: preparing a table showing a correlation between the sensitivity and the specific parameters; and calculating a worst-case parameter, using the table, from:

$$x_w=\mu_x+B_{Table}\Sigma_x$$

where $x_w$ is a worst-case parameter vector or matrix; $\mu_x$ is a mean vector or matrix of a parameter x; $B_{Table}$ is a sensitivity vector or matrix; and $\Sigma_x$ is a variance vector or matrix.

According to an eighth aspect of the present invention, the step (e) of the characteristic variation evaluation method includes, instead of the steps of the sixth aspect, the step of calculating sensitivity, on the basis of the data with outliers eliminated therefrom, from:

$$B=EXP[(p-\mu_p)/(x-\mu_x)^t]$$

where B is a sensitivity vector or matrix, x is a parameter vector or matrix, p is a characteristic-value vector or matrix, $\mu_x$ and $\mu_p$ are mean vectors or matrices of x and p, respectively, EXP is an expected value, and t is a transposed matrix; and the step of calculating a worst-case parameter from the sensitivity.

According to a ninth aspect of the present invention, the step (e) of the characteristic variation evaluation method includes, instead of the steps of the sixth aspect, the step of calculating sensitivity on the basis of the data with outliers eliminated therefrom; and the step of calculating a worst-case parameter, using a calculation result of the sensitivity, from:

$$x_w=\mu_x+\Sigma_x B\Sigma_p^{-1}\delta_p$$

where $x_w$ is a worst-case parameter vector or matrix, $\mu_x$ is a mean vector or matrix of the parameter x, $\Sigma_x$ and $\Sigma_p$ are variance-covariance matrices of x and p, respectively, $\delta_p$ is a vector obtained by subtracting the mean vector or matrix $\mu_p$ from the characteristic-value vector or matrix p, B is a sensitivity vector or matrix, and −1 indicates an inverse matrix.

According to a tenth aspect of the present invention, the step (e) of the characteristic variation evaluation method includes, instead of the steps of the sixth aspect, the step of calculating sensitivity on the basis of the data with outliers eliminated therefrom; and the step of calculating a worst-case parameter, using a calculation result of the sensitivity, from:

$$x_w=\mu_x+(B^t)^+\delta_p$$

where $x_w$ is a worst-case parameter vector or matrix, $\mu_x$ is a mean vector or matrix of the parameter x, B is a sensitivity vector or matrix, t is a transposed matrix, $(B^t)^+$ is a generalized inverse matrix of $B^t$, $\delta_p$ is a vector or matrix obtained by subtracting the mean vector or matrix $\mu_p$ from the characteristic-value vector or matrix p.

An eleventh aspect of the present invention is directed to a characteristic variation evaluation unit of semiconductor devices. The unit comprises an outlier elimination unit eliminating outliers from measured data of a characteristic value of semiconductor devices; a typical parameter extraction unit selecting a typical semiconductor device having data that is typical among the measured data with outliers eliminated therefrom from semiconductor devices used for the measurement and extracting predetermined parameters concerning the characteristic value of the typical semiconductor device as typical parameters; a selection unit selecting specific parameters used for the generation of a worst-case parameter from the predetermined parameters; a worst-case parameter generation unit generating a worst-case parameter from the specific parameters on the basis of the measured data with outliers eliminated therefrom; and a worst-case parameter verification unit verifying a worst-case parameter by utilizing the worst-case parameter generated by the worst-case parameter generation unit and the typical parameters excepting the worst-case parameter. The parameter selection unit includes means for extracting an equation that expresses the characteristic value by some of the predetermined parameters; means for obtaining a correlation coefficient between the measured characteristic value and a characteristic value calculated from the equation; and means for selecting specific parameters from those of the predetermined parameters, using the correlation coefficient.

According to a twelfth aspect of the present invention, the parameter selection unit of the characteristic variation evaluation unit includes, instead of the means of the eleventh aspect, means for obtaining sensitivity from some of the predetermined parameters; means for obtaining respective inner products of the sensitivity and those of the predetermined parameters to obtain respective correlation coefficients between the inner products and the measured characteristic value; and means for selecting specific parameters from the correlation coefficients.

According to a thirteenth aspect of the present invention, the parameter selection unit of the characteristic variation evaluation unit includes, instead of the means of the eleventh aspect, means for obtaining sensitivity from some of the predetermined parameters; means for obtaining respective standard partial regression coefficients of those of the predetermined parameters from the sensitivity; and means for selecting specific parameters from the standard partial regression coefficients.

According to a fourteenth aspect of the present invention, the parameter selection unit of the characteristic variation evaluation unit includes, instead of the means of the eleventh aspect, means for obtaining respective variable coefficients of some of the predetermined parameters; and means for selecting specific parameters from the variable coefficients.

A fifteenth aspect of the present invention is directed to a characteristic variation evaluation unit of semiconductor devices. The unit comprises: an outlier elimination unit eliminating outliers from measured data of a characteristic value of semiconductor devices; a typical-parameter extraction unit selecting a typical semiconductor device having data that is typical among the measured data with outliers eliminated therefrom from semiconductor devices used for the measurement and extracting predetermined parameters concerning the characteristic value of the typical semiconductor device as typical parameters; a selection unit selecting specific parameters used for the generation of a worst-case parameter from the predetermined parameters; a worst-case parameter generation unit generating a worst-case parameter from specific parameters on the basis of the measured data with outliers eliminated therefrom; and a worst-case parameter verification unit verifying a worst-case parameter by utilizing the worst case-parameter generated by the worst-case parameter generation unit and the typical parameters excepting the parameters used for the generation of the worst-case parameter. The worst-case parameter generation unit includes means for calculating sensitivity, on the basis of the data with outliers eliminated therefrom, from:

$$B=\Sigma_x^{-1}(x-\mu_x)/(p-\mu_p)^t \Sigma_p$$

where B is a sensitivity vector or matrix, x is a parameter vector or matrix, p is a characteristic-value vector or matrix, $\mu_x$ and $\mu_p$ are mean vectors or matrices of x and p, respectively, $\Sigma_x$ and $\Sigma_p$ are variance-covariance matrices of x and p, respectively, −1 indicates an inverse matrix, and t is a transposed matrix; and means for calculating a worst-case parameter from the sensitivity.

According to a sixteen aspect of the present invention, the worst-case parameter generation unit of the characteristic variation evaluation unit includes, instead of the means of the fifteenth aspect, means for calculating sensitivity, on the basis of the data with outliers eliminated therefrom, from:

$$B=EXP[(p-\mu_p)/(x-\mu_x)^t]$$

where B is a sensitivity vector or matrix, x is a parameter vector or matrix, p is a characteristic-value vector or matrix, $\mu_x$ and $\mu_p$ are mean vectors or matrices of x and p, respectively, EXP is an expected value, and t is a transposed matrix; and means for calculating a worst-case parameter from the sensitivity.

According to a seventeenth aspect of the present invention, the worst-case parameter generation unit of the characteristic variation evaluation unit includes, instead of the means of the fifteenth aspect, means for calculating sensitivity on the basis of the data with outliers eliminated therefrom; and means for calculating a worst-case parameter, using a calculation result of the sensitivity, from:

$$x_w=\mu_x+\Sigma_x B \Sigma_p^{-1} \delta_p$$

where $x_w$ is a worst-case parameter vector or matrix, $\mu_x$ is a mean vector or matrix of the parameter x, $\Sigma_x$ and $\Sigma_p$ are variance-covariance matrices of x and p, respectively, $\delta_p$ is a vector obtained by subtracting the mean vector or matrix $\mu_p$ from the characteristic-value vector or matrix p, B is a sensitivity vector or matrix, and −1 indicates an inverse matrix.

According to an eighteenth aspect of the present invention, the worst-case parameter generation unit of the characteristic variation evaluation unit includes, instead of the means of the fifteenth aspect, means for calculating sensitivity on the basis of the data with outliers eliminated therefrom; and means for calculating a worst-case parameter, using a calculation result of the sensitivity, from:

$$x_w=\mu_x+(B^t)^+\delta_p$$

where $x_w$ is a worst-case parameter vector or matrix, $\mu_x$ is a mean vector or matrix of the parameter x, B is a sensitivity vector or matrix, t is a transposed matrix, $(B^t)^+$ is generalized inverse matrix of $B^t$, $\delta_p$ is a vector or matrix obtained by subtracting the mean vector or matrix $\mu_p$ from the characteristic-value vector or matrix p.

According to a nineteenth aspect of the present invention, the worst-case parameter generation unit of the characteristic variation evaluation unit includes, instead of the means of the fifteenth aspect, means for storing a table showing a correlation between the sensitivity and the specific parameters; and means for calculating a worst-case parameter, using the table, from:

$$x_w=\mu_x+B_{Table}\Sigma_x$$

where $x_w$ is a worst-case parameter vector or matrix; $\mu_x$ is a mean vector or matrix of the parameter x; $B_{Table}$ is a sensitivity vector or matrix; and $\Sigma_x$ is a variance vector or matrix.

A twentieth aspect of the present invention is directed to a storage medium for storing a program for having a computer execute at least the steps, excepting the step (a), of the characteristic variation evaluation method of either of the first to tenth aspects.

A twenty-first aspect of the present invention is directed to a storage medium for storing a program for having a computer function as the characteristic variation evaluation unit of either of the eleventh to nineteenth aspects.

In the characteristic variation evaluation method of semiconductor devices according to the first aspect, the specific parameters used for the generation of the worst-case parameter are selected on the basis of the coefficient concerning the specific parameters. This facilitates selection of the specific parameters.

In the characteristic variation evaluation method of semiconductor devices according to the second aspect, the characteristic variation evaluation unit of semiconductor devices according to the eleventh aspect, and the storage medium according to the twentieth or twenty-first aspect, the specific parameters used for the generation of the worst-case parameter are selected on the basis of the correlation coefficient between the calculated characteristic value and measured characteristic value. This allows unique selection of the specific parameters without great difficulty.

In the characteristic variation evaluation method of semiconductor devices according to the third aspect, the characteristic variation evaluation unit of semiconductor devices according to the twelfth aspect, and the storage medium according to the twentieth or twenty-first aspect, the specific parameters used for the generation of the worst-case parameter are selected on the basis of the correlation coefficients between the characteristic value and the inner produces calculated from several parameters and sensitivity. This allows unique selection of the specific parameters without great difficulty and shortens calculation time.

In the characteristic variation evaluation method of semiconductor devices according to the fourth aspect, the characteristic variation evaluation unit of semiconductor devices according to the thirteenth aspect, and the storage medium according to the twentieth or twenty-first aspect, the specific parameters used for the generation of the worst-case parameter are selected on the basis of the standard partial regression coefficients of several parameters. This allows unique selection of the specific parameters without great difficulty and facilitates calculation of each parameter.

In the characteristic variation evaluation method of semiconductor devices according to the fifth aspect, the characteristic variation evaluation unit of semiconductor devices according to the fourteenth aspect, and the storage medium according to the twentieth or twenty-first aspect, the specific parameters used for the generation of the worst-case parameter are selected on the basis of the variable coefficients of several parameters. This allows unique selection of the specific parameters without great difficulty and facilitates calculation of each parameter.

In the characteristic variation evaluation method of semiconductor devices according to the sixth aspect, the characteristic variation evaluation unit of semiconductor devices according to the fifteenth aspect, and the storage medium according to the twentieth or twenty-first aspect, sensitivity is obtained from the mean values and the variances in the step of generating the worst-case parameter. This facilitates calculation.

In the characteristic variation evaluation method of semiconductor devices according to the seventh aspect, the characteristic variation evaluation unit of semiconductor devices according to the nineteenth aspect, and the storage medium according to the twentieth or twenty-first aspect, the worst-case parameter can be calculated only from the mean values and the standard deviation in the step of generating the worst-case parameter.

In the characteristic variation evaluation method of semiconductor devices according to the eighth aspect, the characteristic variation evaluation unit of semiconductor devices according to the sixteenth aspect, and the storage medium according to the twentieth or twenty-first aspect, statistical sensitivity can be readily calculated in the step of generating the worst-case parameter.

In the characteristic variation evaluation method of semiconductor devices according to the ninth aspect, the characteristic variation evaluation unit of semiconductor devices according to the seventeenth aspect, and the storage medium according to the twentieth or twenty-first aspect, the step of generating the worst-case parameter increases accuracy in the calculation of the variations of the characteristic value as compared in the conventional method.

In the characteristic variation evaluation method of semiconductor devices according to the tenth aspect, the characteristic variation evaluation unit of semiconductor devices according to the eighteenth aspect, and the storage medium according to the twentieth or twenty-first aspect, the step of generating the worst-case parameter enables calculation even when the number of parameters is different from the number of characteristic values.

Thus, an objective of the present invention is to facilitate the selection of parameters used for the generation of the worst-case parameter by doing it mechanically. Another objective is to facilitate the calculation of sensitivity in the generation of the worst-case parameter. Another objective is to increase accuracy in the calculation of the worst-case parameter as compared with the conventional method. Another objective is to facilitate the calculation of the worst-case parameter when the number of parameters is different from the number of characteristic values. Another objective is to simplify the calculation of the worst-case parameter to shorten calculation time.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 18A to 18D show a correlation between measured values and parameter combinations.

FIG. 19 shows a correlation between measured values and calculated values of current driving capability.

DESCRIPTION OF THE PREFERRED EMBODIMENTS

1. First Preferred Embodiment

Figure 13:
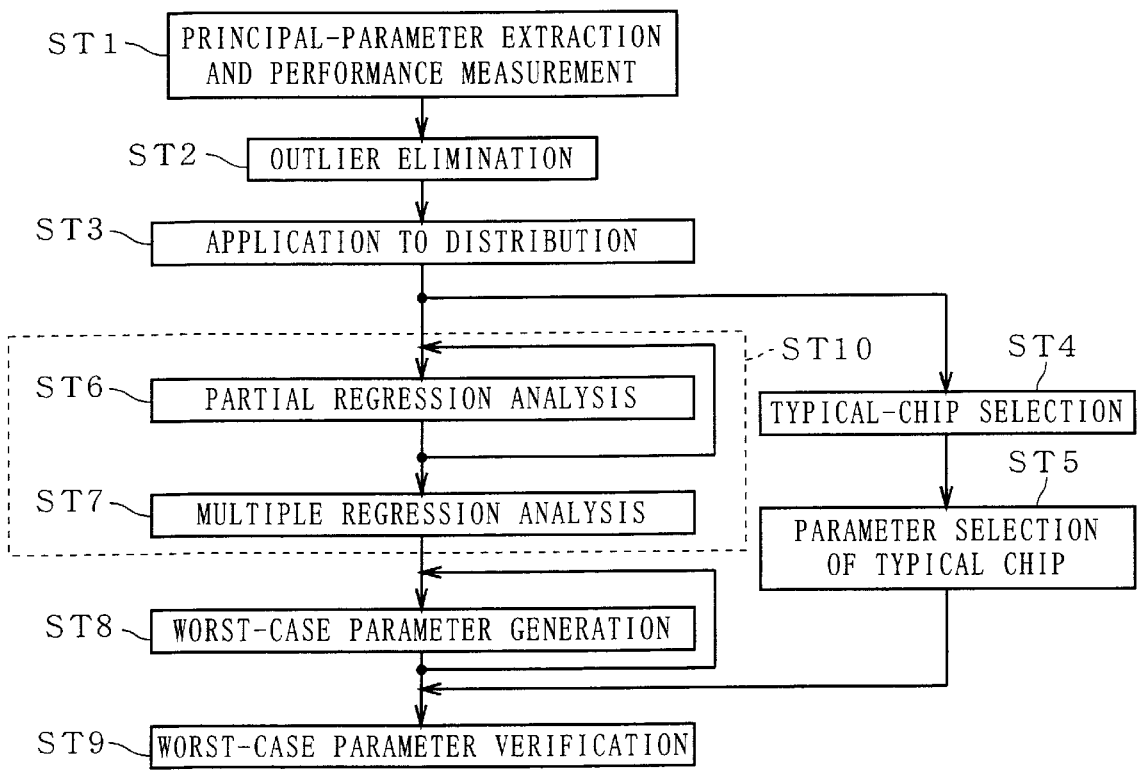
FIG. 13 is a flow chart of a conventional characteristic variation evaluation method.
Figure 14:
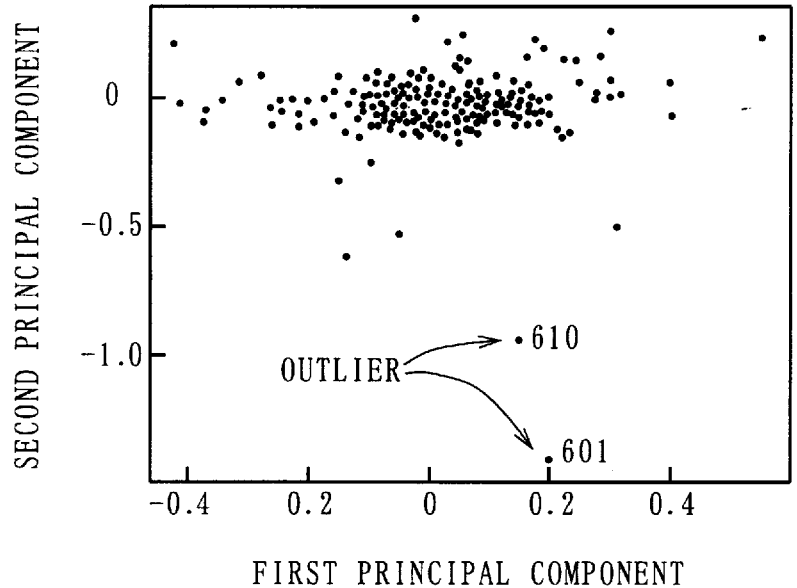
FIG. 14 shows a correlation between components before outlier elimination.
Figure 15:
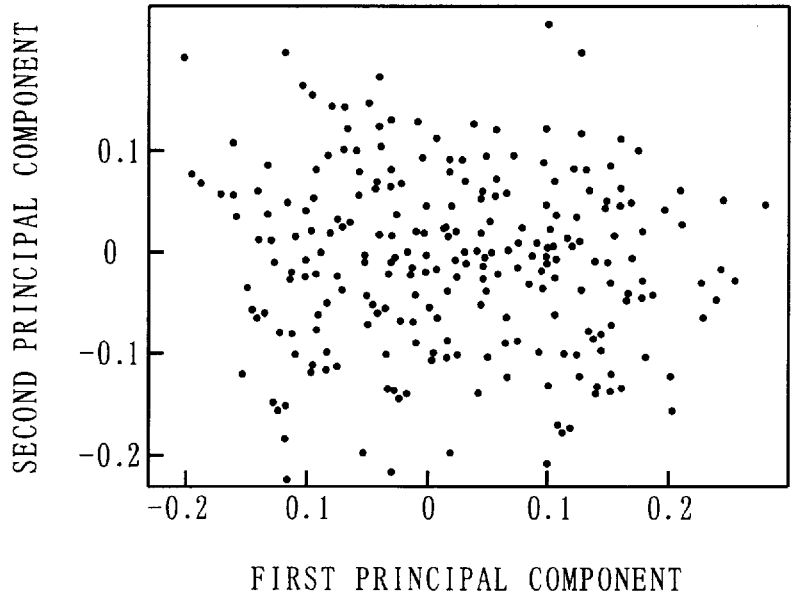
FIG. 15 shows a correlation between components after outlier elimination.
Figure 16A:
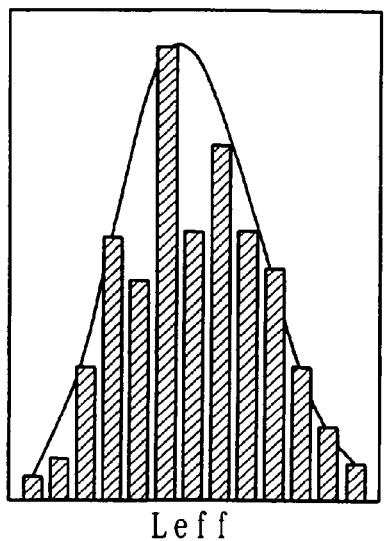
FIGS. 16A to 16F are graphs showing a characteristic value and principal parameters applied to normal distribution.
Figure 16B:
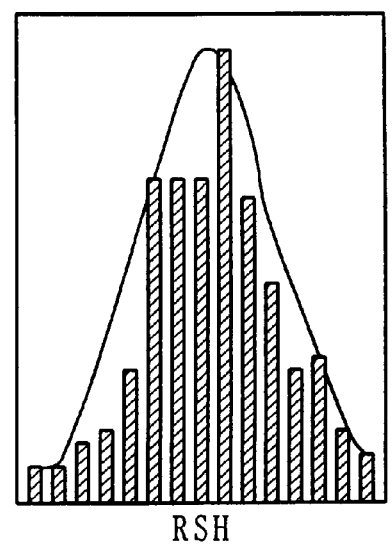
Figure 16C:
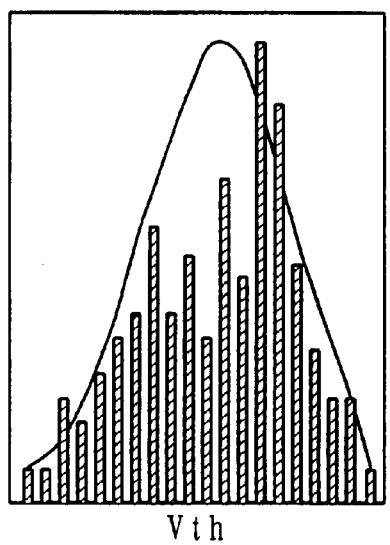
Figure 16D:
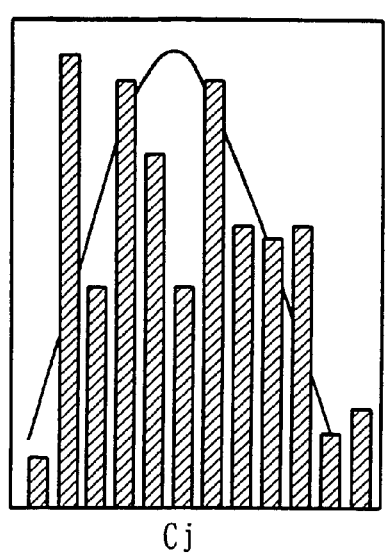
Figure 16E:
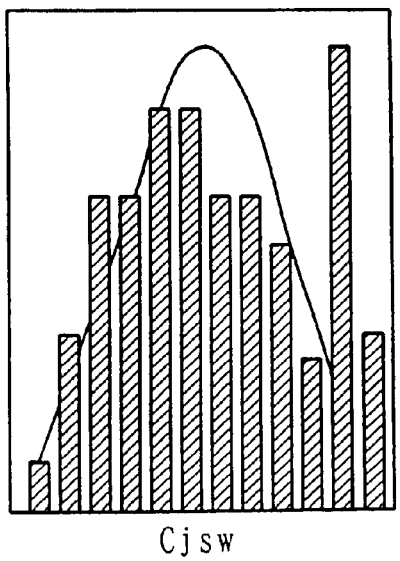
Figure 16F:
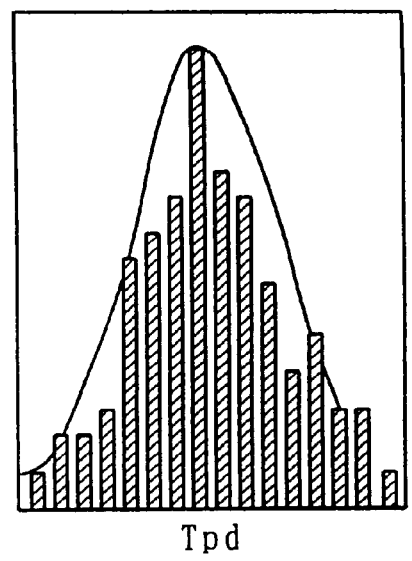
Figure 17:
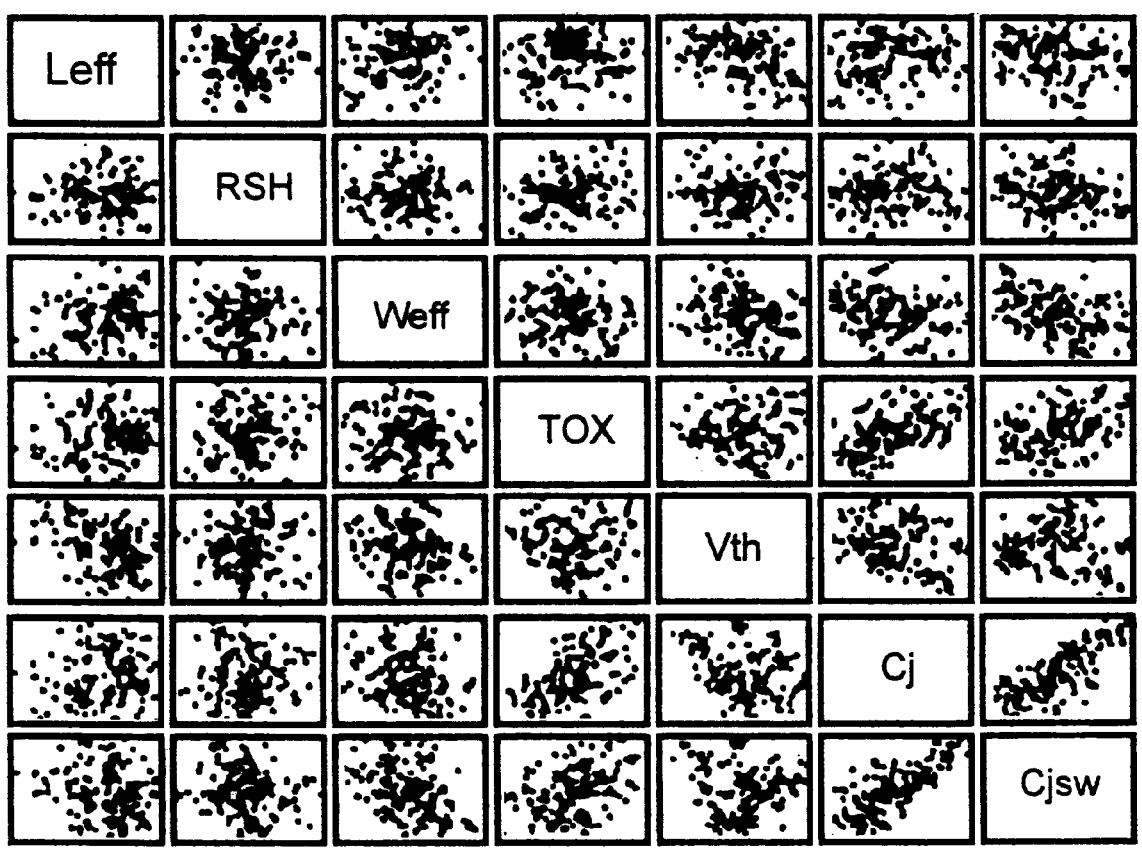
FIG. 17 shows a correlation between the principal parameters.
Figure 20:
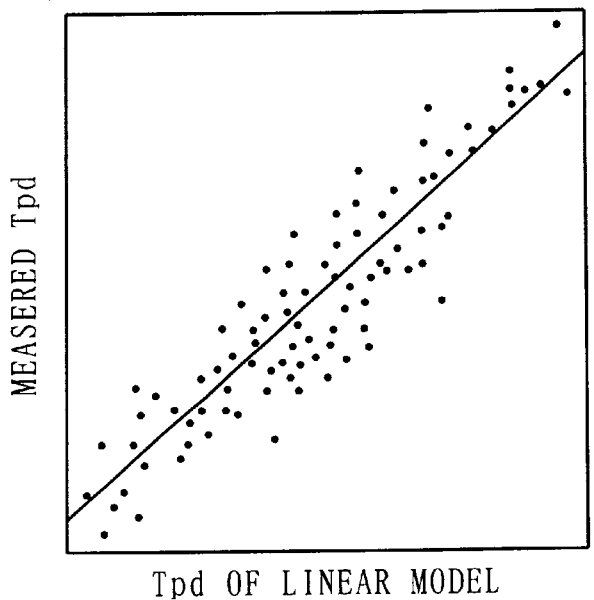
FIG. 20 shows a correlation between measured values and calculated values of a delay time of an inverter chain, using a linear model.
Figure 21:
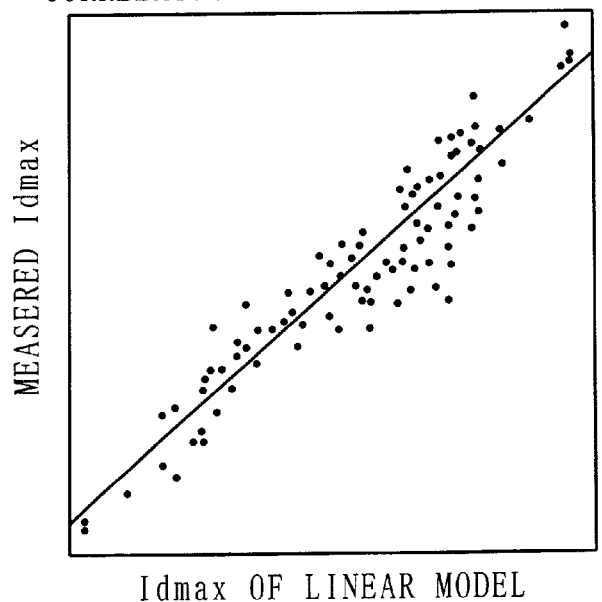
FIG. 21 shows a correlation between measured values and calculated values of current driving capability of a transistor, using a linear model.
Figure 22:
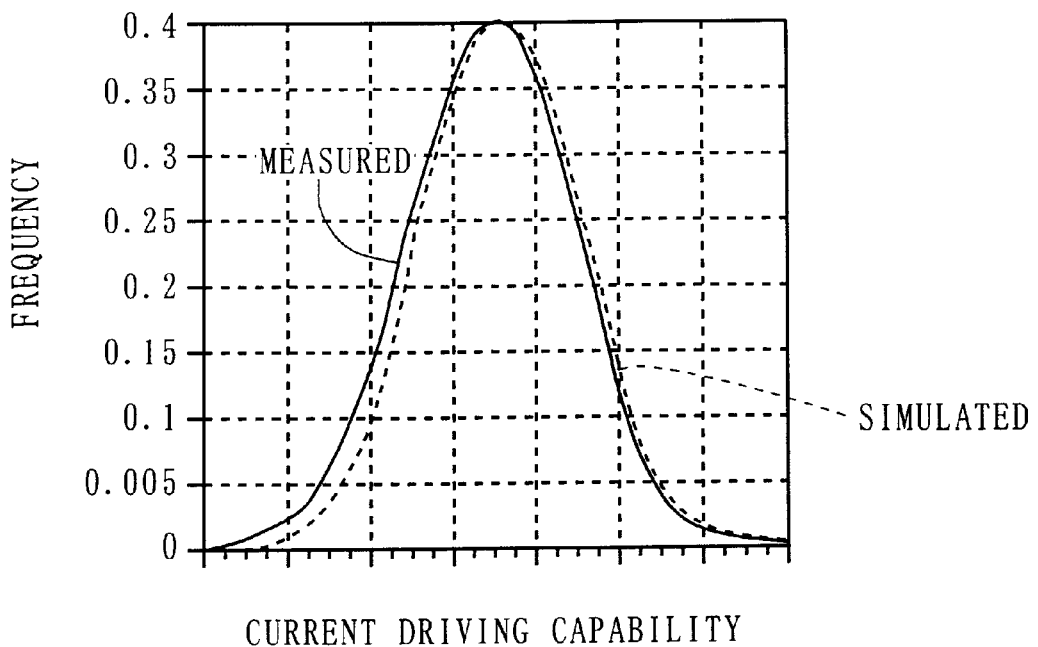
FIG. 22 is a graph showing a comparison between measured values and simulated values of current driving capability.
Figure 23:
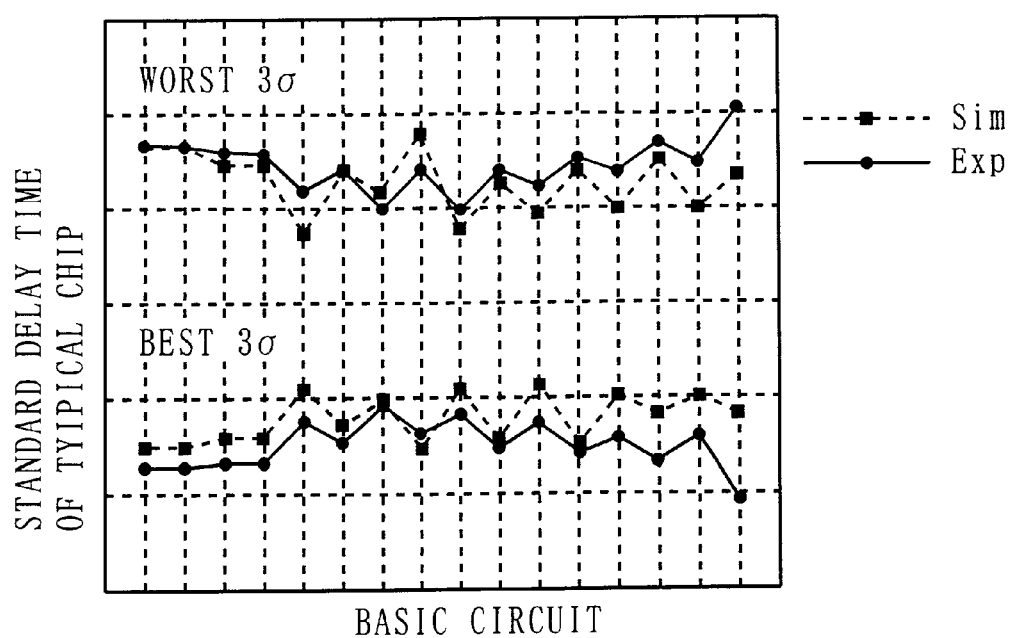
FIG. 23 is a graph showing a comparison between measured values and simulated values of a basic circuit in the worst/best case.

Characteristic variation evaluation method and unit of semiconductor devices according to a first preferred embodiment of the present invention are obtained with improvements in parameter selection by the conventional basic method. That is, step ST10 of the conventional method in FIG. 13 is substituted by step ST20 as shown in FIG. 1.

Figure 1:
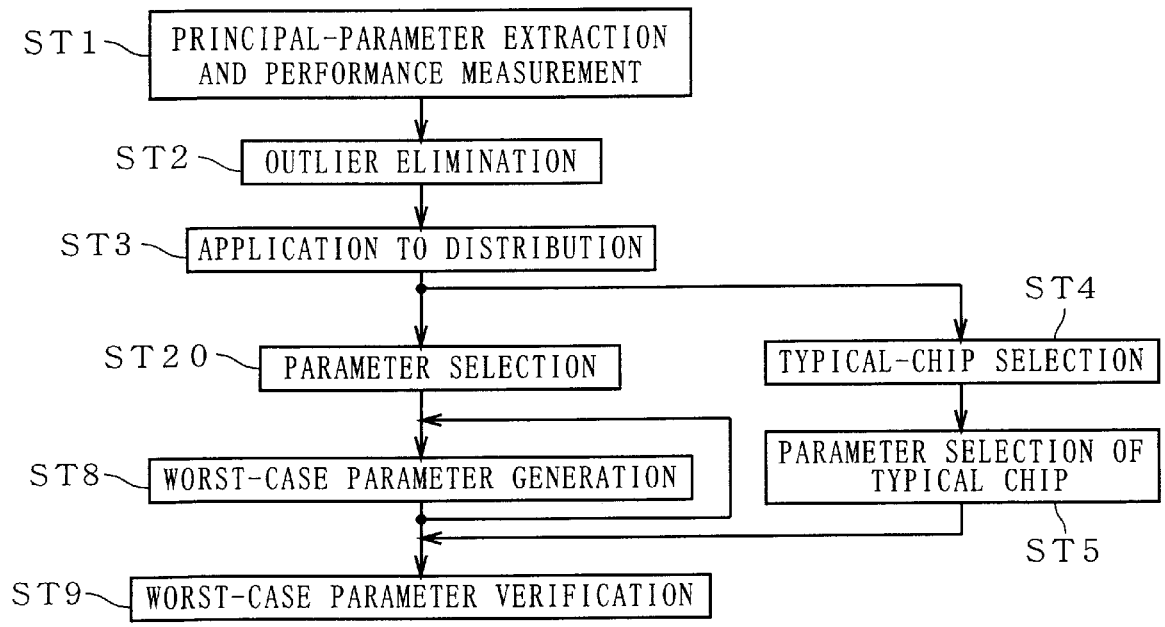
FIG. 1 is a flow chart of a characteristic variation evaluation method according to first to fourth preferred embodiments.
Figure 2:
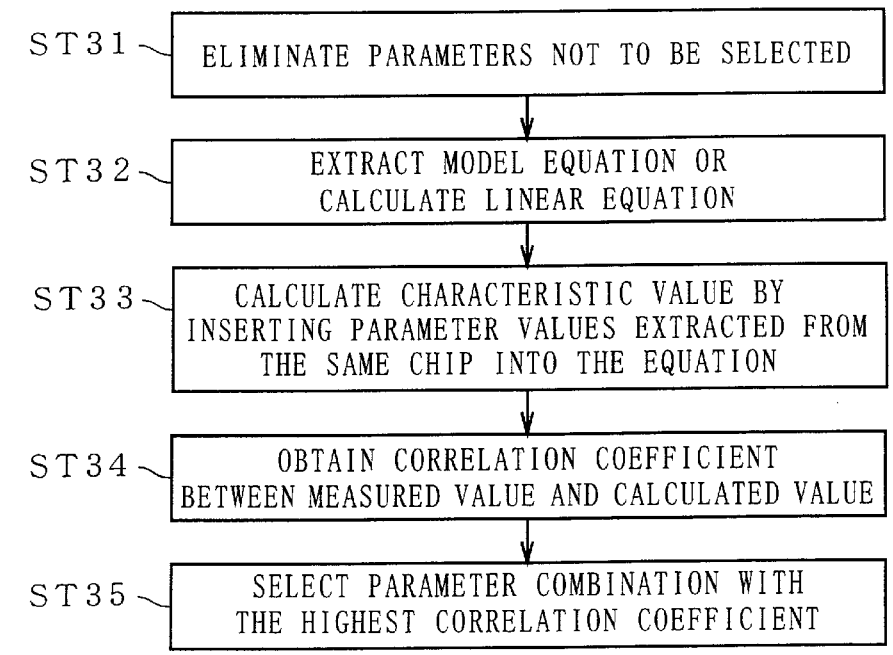
FIG. 2 is a flow chart of a selection step according to the first preferred embodiment.
Figure 3:
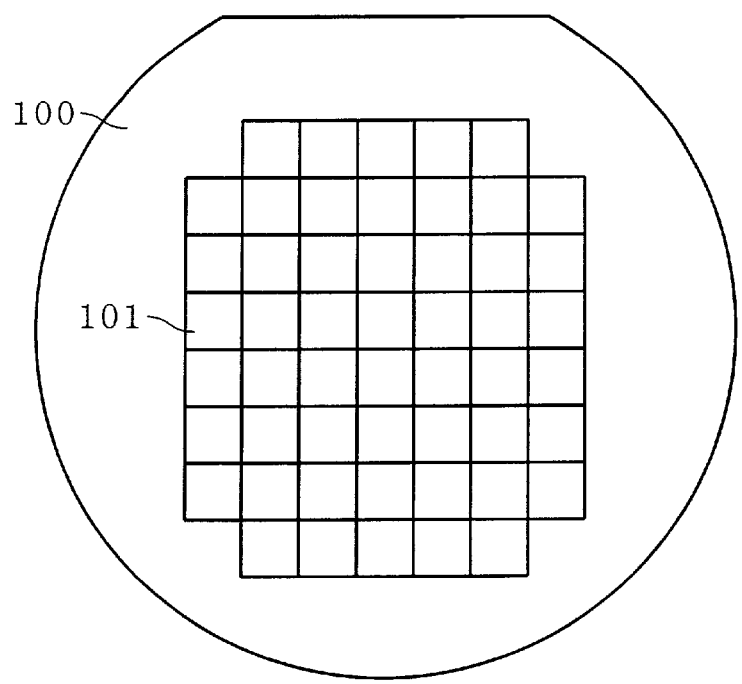
FIG. 3 is a conceptual diagram of a wafer, for giving an explanation of parameter selection.
Figure 4:
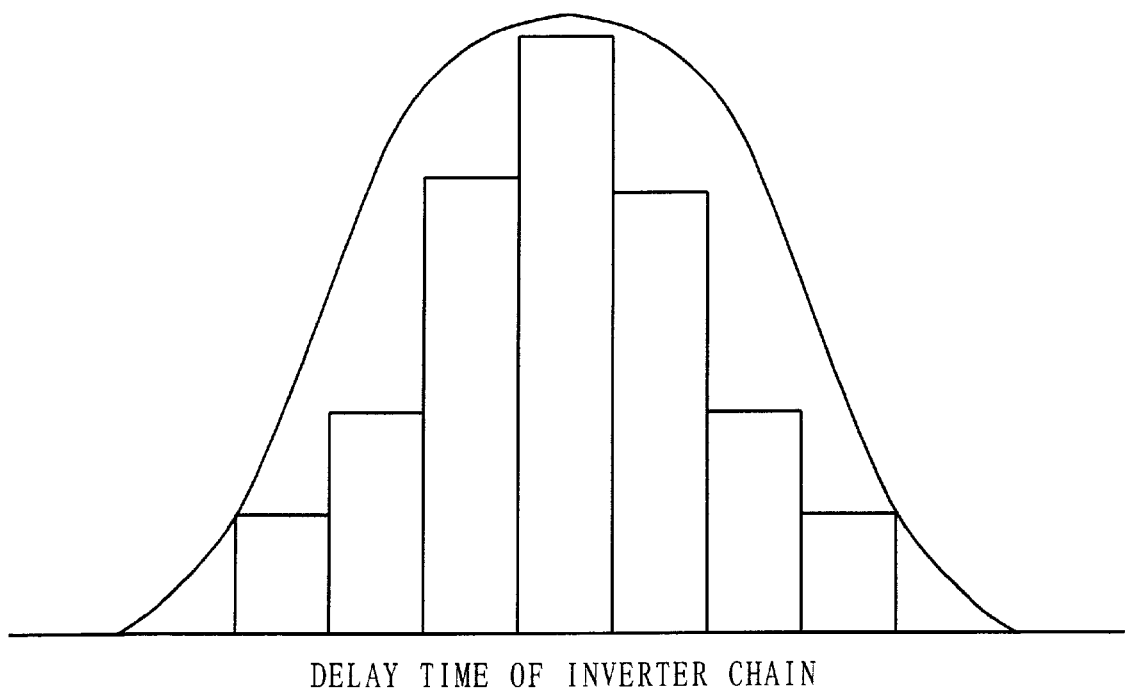
FIG. 4 shows a histogram of a delay time, for giving an explanation of parameter selection.

FIG. 2 is a flow chart of step ST20 in FIG. 1 according to the first preferred embodiment. First at step ST31, parameters having little possibility of being the worst-case parameter are eliminated from principal parameters. Here, the principal parameters correspond to the predetermined parameters extracted at step ST1. FIG. 3 is a conceptual view of a wafer with a plurality of integrated circuit formed thereon. For instance, a characteristic value such as circuit delay time Tpd and current driving capability Idmax, is measured from each chip 101 on a wafer 100. The characteristic value is measured by the remaining parameters not eliminated at step ST31, but it is also possible to use all principal parameters for the measurement. Sufficient measuring points are used for the measurement but not so many that adjustment in flexibility is required. In general, parameter values are different in each chip 101 with an integrated circuit, so that the measured characteristic value varies from chip to chip. FIG. 4 is a histogram showing an example of the measured characteristic value (in this case, delay time of an inverter chain). As shown in FIG. 4, the characteristic value usually has a normal distribution.

At the next step ST32, model equations are extracted or linear equations are calculated as follows:

$$Id\ max_{sim} = f(Leff)$$

$$Id\ max_{sim} = f(Weff)$$

.

.

.

$$Id\ mmax_{sim} = f(Leff,\ Weff)$$

.

.

.

$$Id\ max_{sim} = f(Leff,\ Weff,\ RSH,\ Vth,\ Tox,\ Vo)$$

As shown, various parameter combinations are set in the model or linear equations. Then at step ST33, parameter values extracted from the same chip whose characteristic value is measured are inserted into the above equations to obtain a calculated characteristic value.

After that, at step ST34, a correlation coefficient between the measured characteristic value and the calculated characteristic value is obtained for each parameter combination expressed by the model or linear equations. For example, the model equation, Idmax=f(Leff, Vth, RSH) has a correlation coefficient of 0.958. In this way, the correlation coefficient of each parameter combination is individually obtained. Then, a parameter combination having the highest correlation coefficient is selected as specific parameters (step ST35). This combination of specific parameters is utilized for generation of the worst-case parameter at step ST8 in FIG. 1. The other steps in FIG. 1 are identical with those denoted by the same reference characters in FIG. 13.

In this fashion, the correlation coefficients of various combinations are obtained. This makes it possible to mechanically and uniquely obtain a combination of specific parameters suitable for generation of the worst-case parameter, thereby facilitating the parameter selection.

Figure 5:
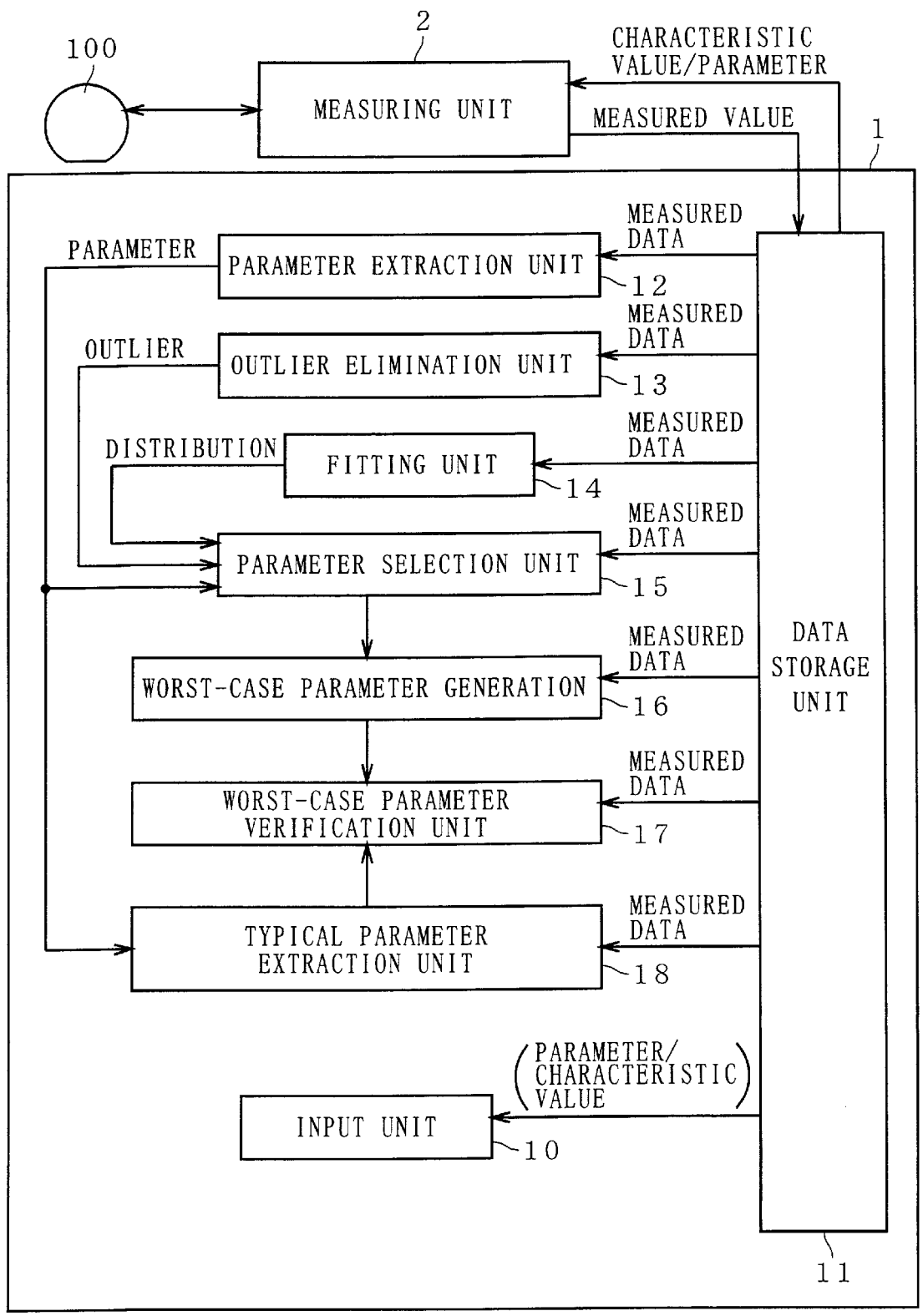
FIG. 5 is a block diagram of a characteristic variation evaluation unit according to the first to fourth preferred embodiments.

Next, we will describe the characteristic variation evaluation unit of semiconductor devices according to the first preferred embodiment. FIG. 5 is a block diagram of the structure of this characteristic variation evaluation unit. A characteristic variation evaluation unit 1 measures characteristics of semiconductor devices, e.g., characteristics of chips formed on the wafer 100. The characteristics to be measured and principal parameters necessary for the measurement are inputted, for example, from an input unit 10. The information from the input unit 10 is stored in a data storage unit 11, through which the other units obtain the information. A parameter extraction unit 12 extracts principal parameters having influences on semiconductor device performance from the measured data stored in the data storage unit 11. An outlier elimination unit 13 performs the outlier elimination of step ST2 in FIG. 1, with the measured data in the data storage unit 11. A fitting unit 14 performs the application to distribution of step ST3 in FIG. 1, with the measured data in the data storage unit 11. A parameter selection unit 15 selects specific parameters used for the generation of the worst-case parameter, from several parameters extracted by the parameter extraction unit 12. Prior to the selection, the parameter selection unit 15 eliminates outliers indicated by the outlier elimination unit 13. The parameter selection unit 15 further can stop the parameter selection when the fitting unit 14 fails in the application to distribution. This is because a failure in the application to distribution is often caused by imperfections in measurement, so that the worst-case parameter generated from such data is likely to be wrong. The generation of the worst-case parameter is thus practicable without the fitting unit 14. A worst-case parameter generation unit 16 generates the worst-case parameter, with the measured data in the data storage unit 11 and the specific parameters from the parameter selection unit 15. The generation of the worst-case parameter by the worst-case parameter generation unit 16 is performed as step ST8 in FIG. 1. At the same time, a typical parameter extraction unit 18 extracts typical parameters through the same processing as steps ST4 and ST5 in FIG. 1 from the measured data in the data storage unit 11. A worst-case parameter verification unit 17 conducts verification of the worst-case parameter, with the worst-case parameter extracted by the worst-case parameter generation unit 16, the typical parameters extracted by the typical parameter extraction unit 18, and the measured data in the data storage unit 11.

2. Second Preferred Embodiment

Characteristic variation evaluation method and unit of semiconductor devices according to a second preferred embodiment of the present invention are obtained with improvements in parameter selection by the conventional basic method. That is, step ST10 of the conventional method in FIG. 13 is substituted by step ST20 as shown in FIG. 1.

Figure 6:
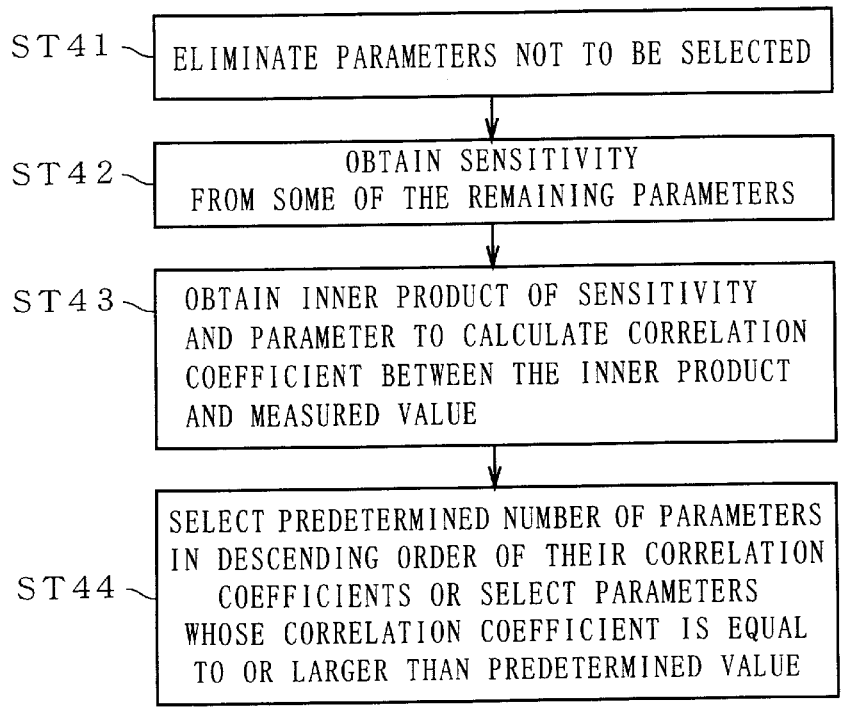
FIG. 6 is a flow chart of a selection step according to the second preferred embodiment.

FIG. 6 is a flow chart of step ST20 in FIG. 1 according to the second preferred embodiment. Step ST41 in FIG. 6 is identical with step ST31 in FIG. 2. More specifically, at step ST41, alternates for specific parameters used for the generation of the worst-case parameter are narrowed down to some of the principal parameters. Then, at step ST42, sensitivity B is obtained from those of the principal parameters, for example, using Equation (8), i.e. B=(A·b), as in the conventional method.

Next, at step ST43, inner products of the sensitivity B and respective those of the principal parameters are obtained to calculate respective correlation coefficients between the inner products and the measured values. Of these parameters, a predetermined number of parameters in descending order of their correlation coefficients calculated at step ST43; or parameters whose correlation coefficients are equal to or larger than a predetermined value are selected as specific parameters (step ST44). The subsequent processing after step ST20 in FIG. 1 is performed by utilizing a combination of these specific parameters.

In this fashion, step ST20 of selecting the specific parameters facilitates calculation and reduces the calculation time.

Further, since the sensitivity B calculated at step ST42 is obtained for each of the parameters not eliminated at step ST41, it is usually different from the sensitivity calculated at step ST8.

The characteristic variation evaluation unit of the second preferred embodiment is different from that of the first preferred embodiment only in the function of the parameter selection unit 15 in FIG. 5. The other part of the structure is identical with that of the first preferred embodiment. The parameter selection unit 15 of the second preferred embodiment has a function of performing the processing illustrated in FIG. 6.

3. Third Preferred Embodiment

Characteristic variation evaluation method and unit of semiconductor devices according to a third preferred embodiment are obtained with improvements in parameter selection by the conventional basic method. That is, step ST10 of the conventional method in FIG. 13 is substituted by step ST20 as shown in FIG. 1.

Figure 7:
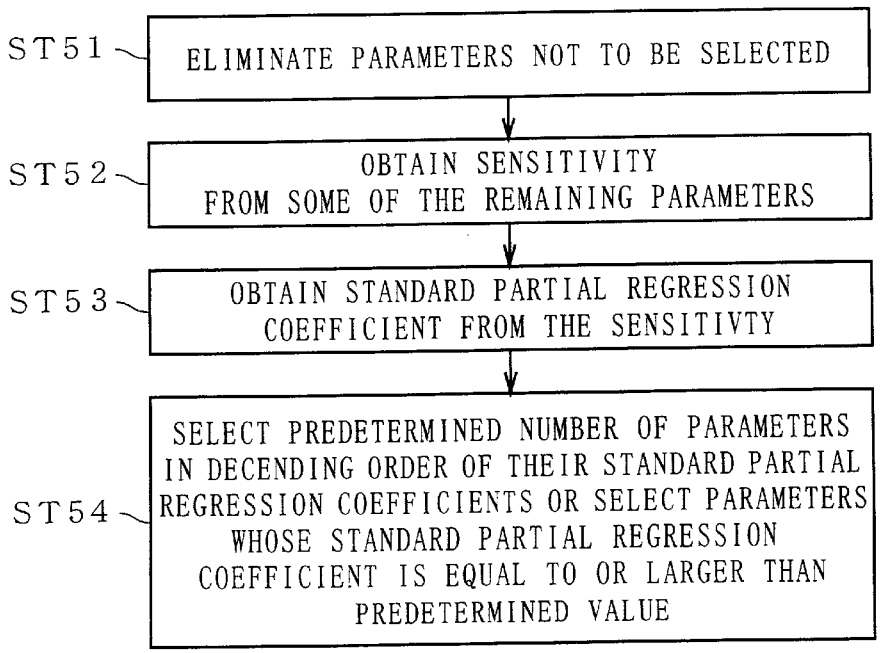
FIG. 7 is a flow chart of a selection step according to the third preferred embodiment.

FIG. 7 is a flow chart of step ST20 in FIG. 1 according to the third preferred embodiment. Steps ST51 and ST52 in FIG. 7 are identical with steps ST41 and ST42 in FIG. 6. More specifically, at step ST51, alternates for specific parameters used for the generation of the worst-case parameter are narrowed down to some of the principal parameters. After steps ST51 and ST52, standard partial regression coefficients of those of the principal parameters are calculated from the sensitivity B obtained at step ST52 (step ST53). The standard partial regression coefficient is obtained by {(standard deviation of the parameter)/(standard deviation of the characteristic value)×sensitivity B}. Of these parameters, a predetermined number of parameters in descending order of their standard partial regression coefficients; or parameters whose standard partial regression coefficients are equal to or larger than a predetermined value, are selected as the specific parameters (step ST54). The subsequent processing after step ST20 in FIG. 1 is performed by utilizing a combination of these specific parameters.

In this fashion, step ST20 of selecting the specific parameters facilitates calculation of each parameter.

Further, since the sensitivity B calculated at step ST52 is obtained for each of the parameters not eliminated at step ST51, it is usually different from the sensitivity calculated at step ST8.

The characteristic variation evaluation units of the third preferred embodiment is different from that of the first preferred embodiment only in the function of the parameter selection unit 15 in FIG. 5. The other part of the structure is identical with that of the first preferred embodiment. The parameter selection unit 15 of the third preferred embodiment has a function to perform the processing illustrated in FIG. 7.

4. Fourth Preferred Embodiment

Characteristic variation evaluation method and unit of semiconductor devices according to a fourth preferred embodiment are obtained with improvements in parameter selection by the conventional basic method. That is, step ST10 of the conventional method in FIG. 13 is substituted by step ST20 as shown in FIG. 1.

Figure 8:
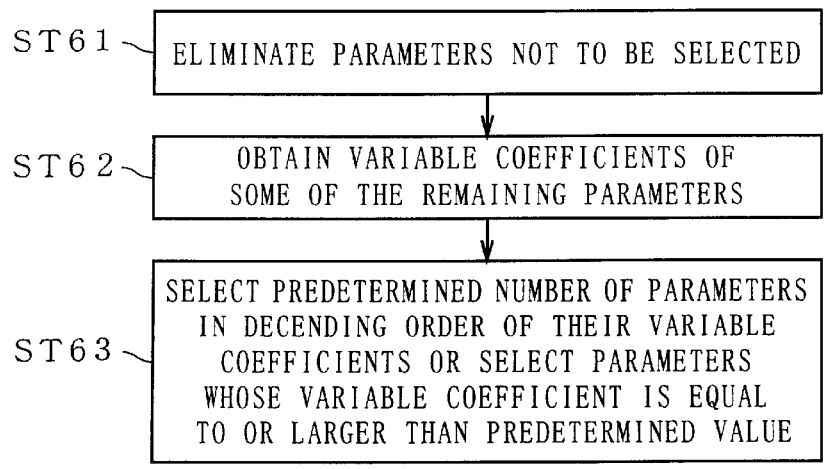
FIG. 8 is a flow chart of a selection step according to the fourth preferred embodiment.

FIG. 8 is a flow chart of step ST20 in FIG. 1 according to the third preferred embodiment. Step ST61 in FIG. 8 is identical with step ST31 in FIG. 2. More specifically, at step ST61, alternates for specific parameters used for the generation of the worst-case parameter are narrowed down to some of the principal parameters. After step ST61, random coefficients of those of the principal parameters are calculated at step ST62. The random coefficient is obtained by dividing the standard deviation of the parameter by the mean value of the same. Of these parameters, a predetermined number of parameters in descending order of their random coefficients; or parameters whose random coefficients are equal to or larger than a predetermined value, are selected as the specific parameters (step ST63). This is because in general a parameter with a higher random coefficient has a greater influence on the characteristics. The subsequent processing after Step ST20 in FIG. 1 is performed by utilizing a combination of these specific parameters.

In this fashion, step ST20 of selecting the specific parameters facilitates calculation of each parameter.

The characteristic variation evaluation unit of the fourth preferred embodiment is different from that of the first preferred embodiment only in the function of the parameter selection unit 15 in FIG. 5. The other part of the structure is identical with that of the first preferred embodiment. The parameter selection unit 15 of the fourth preferred embodiment has a function to perform the processing illustrated in FIG. 8.

5. Fifth Preferred Embodiment

Figure 9:
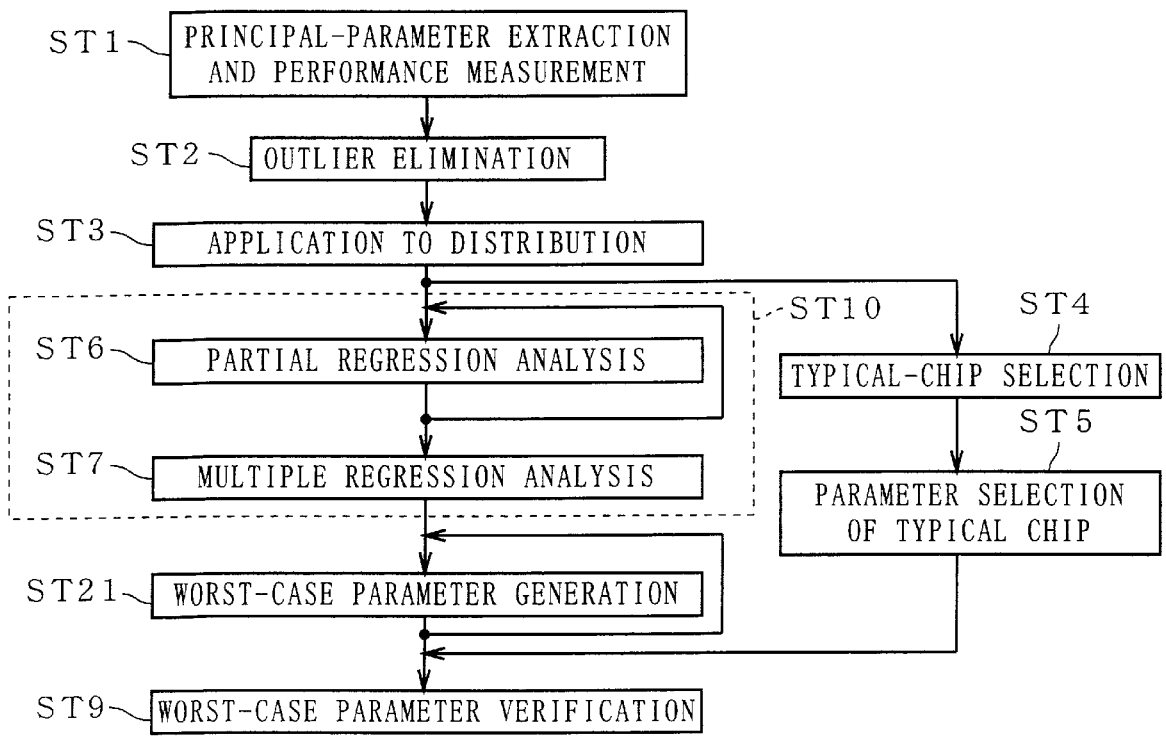
FIG. 9 is a flow chart of a characteristic variation evaluation method according to fifth to ninth preferred embodiments of the present invention.
Figure 10:
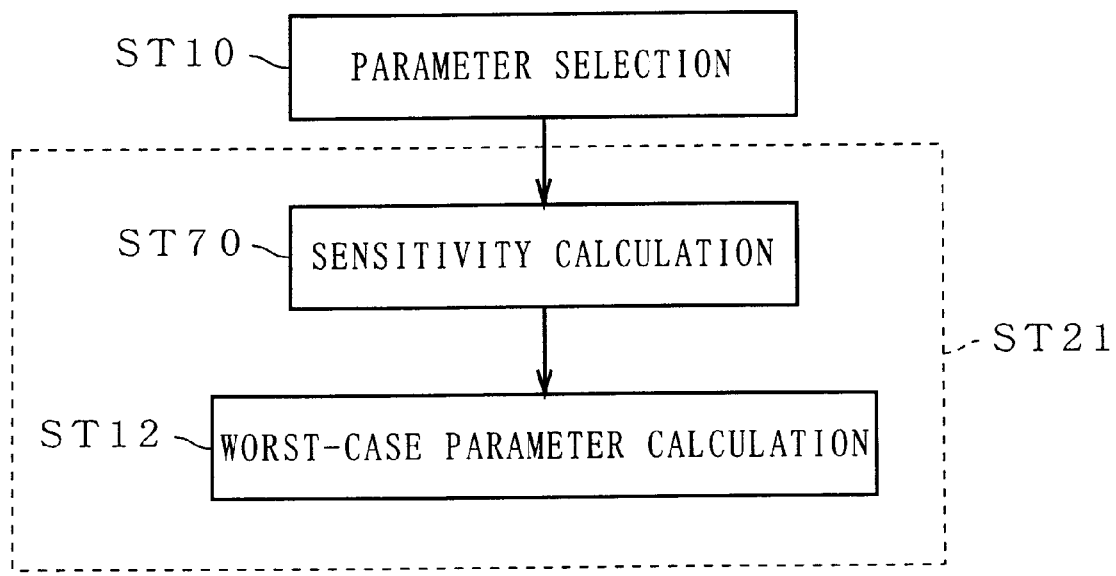
FIG. 10 is a flow chart of a worst-case parameter generation step according to the fifth and sixth preferred embodiments.
Figure 24:
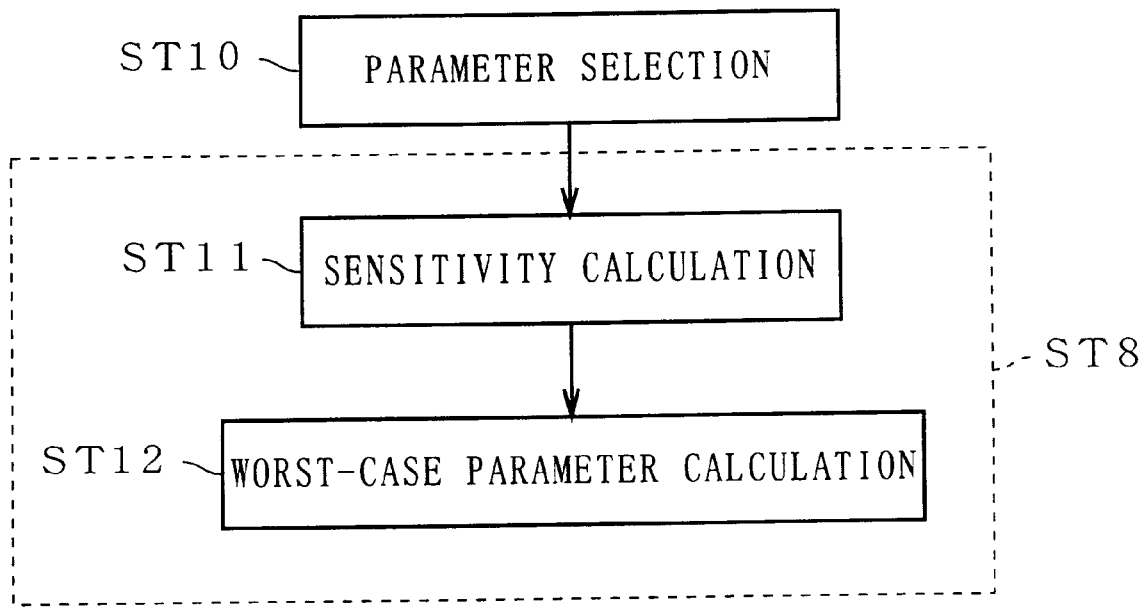
FIG. 24 is a flow chart of a conventional worst-case parameter generation step.

Characteristic variation evaluation method and unit of semiconductor devices according to a fifth preferred embodiment are obtained with improvements in the step or means of calculating sensitivity of the conventional basic method. That is, step ST8 of the conventional method in FIG. 13 is substituted by step ST21 as shown in FIG. 9. More specifically, step ST11 (sensitivity calculation) of the conventional method in FIG. 24 is substituted by step ST70 as shown in FIG. 10 to achieve the characteristic variation evaluation method and unit of the fifth preferred embodiment.

In the conventional method, the sensitivity B is calculated from Equation (8) through the principal component analysis and the regression analysis on the characteristic value. In the method of the fifth preferred embodiment, on the other hand, the sensitivity B is obtained at step ST70 by:

$$B = \Sigma_x^{-1}(x-\mu_x)/(p-\mu_p)^t \Sigma_p \tag{9}$$

where $\mu x$ and $\mu p$ are the mean values of the parameter x and the characteristic value p, respectively; $\Sigma x$ is the variance-covariance matrix of the parameter x; $-1$ is the inverse matrix; B is the sensitivity vector or matrix; $\Sigma p$ is the variance-covariance matrix of the characteristic value p. The mean values $\mu x$ and $\mu p$ can be substituted by measured values close to the mean values. Further, the variance and the covariance in the variance-covariance matrices $\Sigma x$ and $\mu p$ can be substituted by measured values close to the variance and the covariance, respectively. The measured value close to the variance $S^2$ of the parameter x is, for example, a value close to the variance $S^2$ in the set $(xi-\mu x)^2$, where xi is a member in the set of the parameter x. The measured value close to the covariance $S_{x1, x2}$ of the parameter x is, for example, a value close to the covariance $S_{x1, x2}$ in the set $(x_{1i}-\mu x_1)(x_{2i}-\mu x_2)$, where the parameter x is a vector; $x_{1i}$ and $x_{2i}$ are a set of elements of the vector; and $\mu x_1$ and $\mu x_2$ are the mean values of those elements, respectively.

For instance, we will describe calculation of Equation (9) with the effective channel length Leff, the threshold voltage Vth, and the external terminal RSH as a parameter. At this time, the vector p is a vector with one row and two columns, having characteristic values p1 and p2 as its elements; and the vector x is a vector with three rows and one column, having the parameters Leff, Vth, and RSH as its elements. In this case, Equation (9) can be rewritten as follows:

$$B = \begin{bmatrix} S_{Leff}^2 & S_{Leff,Vth} & S_{Leff,RSH} \\ S_{Vth,Leff} & S_{Vth}^2 & S_{Vth,RSH} \\ S_{RSH,Leff} & S_{RSH,Vth} & S_{RSH}^2 \end{bmatrix}^{-1} \begin{bmatrix} \frac{\delta Leff}{\delta P_1} & \frac{\delta Leff}{\delta P_2} \\ \frac{\delta Vth}{\delta P_1} & \frac{\delta Vth}{\delta P_2} \\ \frac{\delta RSH}{\delta P_1} & \frac{\delta RSH}{\delta P_2} \end{bmatrix} \begin{bmatrix} S_1^2 & S_{12} \\ S_{21}^2 & S_2^2 \end{bmatrix}$$

where $\delta$ is the distance from the mean value, e.g., $\delta Leff = Leff-\mu_{Leff}$; $S_i$ is the standard deviation of i; $S_{i,j}$ is the covariance of i and j; and $\partial p/\partial i$ is the sensitivity of p to i.

In Equation (9) at step ST21 of the fifth preferred embodiment, the sensitivity B can be calculated from the mean values and the variances. This facilitates calculation.

Further, while step ST20 of the first to fourth preferred embodiments uses the conventional method to obtain sensitivity, it is also possible to use step ST21 of the fifth preferred embodiment for the calculation of sensitivity in the first to fourth preferred embodiments.

Figure 11:
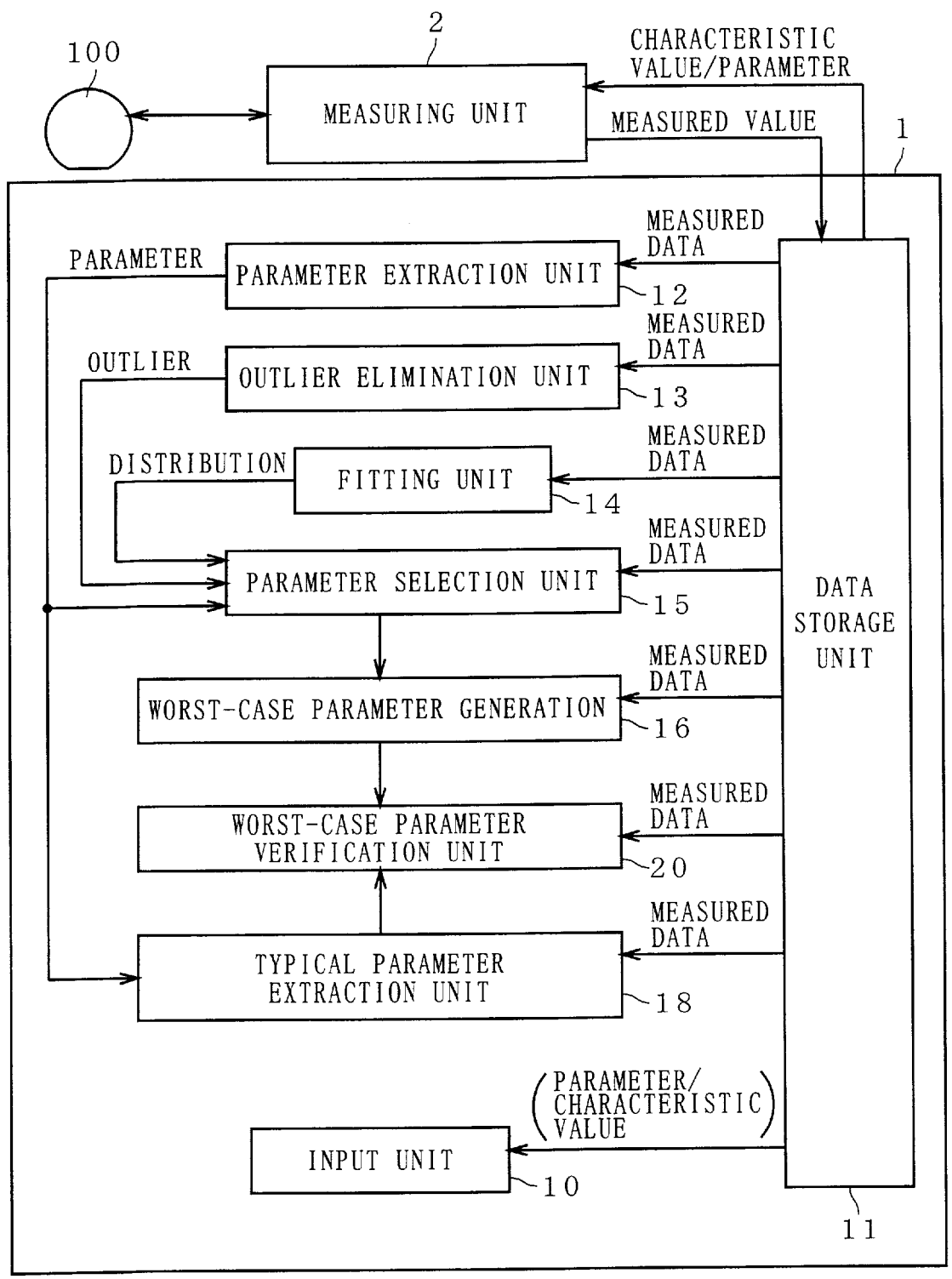
FIG. 11 is a block diagram of a characteristic variation evaluation unit according to the fifth to ninth preferred embodiments.

The characteristic variation evaluation unit of the fifth preferred embodiment in FIG. 11 is different from those of the first to fourth preferred embodiments in FIG. 5 only in the function of a worst-case parameter generation unit 20. The other part of the structure is identical with that of the first to fourth preferred embodiments. The worst-case parameter generation unit 20 of the fifth preferred embodiment has a function to perform the processing of step ST21 illustrated in FIG. 9.

6. Sixth Preferred Embodiment

Characteristic variation evaluation method and unit of semiconductor devices according to a sixth preferred embodiment of the present invention are obtained with improvements in the step or means of calculating sensitivity of the conventional basic method. That is, step ST8 of the conventional method in FIG. 13 is substituted by step ST21 as shown in FIG. 9. More specifically, step ST11 (sensitivity calculation) of the conventional method in FIG. 24 is substituted by step ST70 as shown in FIG. 10 to achieve the characteristic variation evaluation method and unit of the fifth preferred embodiment.

In the conventional method, the sensitivity B is calculated from Equation (8) through the principal component analysis and the regression analysis on the characteristic value. In the method of the sixth preferred embodiment, on the other hand, the sensitivity B is obtained at step ST70 by:

$$B = EXP[(p-\mu_p)/(x-\mu_x)^t] \tag{10}$$

To obtain an expected value of a plurality of chips C1 to Cn, for example, the value $(p-\mu p)/(x-\mu x)^t$ of each chip is calculated. That is, the characteristic value p and the parameter x of each chip are first extracted for Equation (10). Then, the average of the values $(p-\mu p)/(x-\mu x)^t$ of the chips C1 to Cn is taken to obtain the expected value EXP $[(p-\mu p)/(x-\mu x)^t]$.

In Equation (10) at step ST21 of the sixth preferred embodiment, the sensitivity B can be calculated from the mean values and the variances. This facilitates calculation.

Further, while step ST20 of the first to fourth preferred embodiments uses the conventional method to obtain sensitivity, it is also possible to use step ST21 of the sixth preferred embodiment for the calculation of sensitivity in the first to fourth preferred embodiments.

The characteristic variation evaluation unit of the sixth preferred embodiment in FIG. 11 is different from those of the first to fourth preferred embodiments in FIG. 5 only in the function of the worst-case parameter generation unit 20. The other part of the structure is identical with that of the first to fourth preferred embodiments. The worst-case parameter generation unit 20 of the sixth preferred embodiment has a function to perform the processing of step ST21 illustrated in FIG. 9.

7. Seventh Preferred Embodiment

Figure 12:
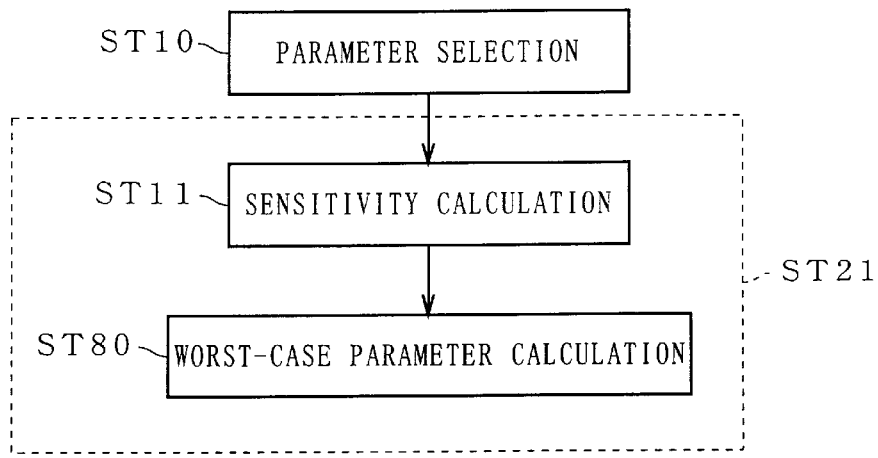
FIG. 12 is a flow chart of a worst-case parameter generation step according to the seventh to ninth preferred embodiments.

Characteristic variation evaluation method and unit of semiconductor devices according to a seventh preferred embodiment of the present invention are obtained with improvements in the step or means of generating the worst-case parameter of the conventional basic method. That is, step ST12 of the conventional method in FIG. 24 is substituted by step ST80 as shown in FIG. 12.

In the conventional method, the worst-case parameter $x_w$ is generated from Equation (7). In the method of the seventh preferred embodiment, on the other hand, the worst-case parameter $x_w$ is found by:

$$x_w = \mu_x + \Sigma_x B \Sigma_p^{-1} \delta_p \tag{11}$$

where p is the characteristic value corresponding to the worst case. The use of Equation (11) for the generation of the worst-case parameter $x_w$ increases accuracy in the calculation of the variations of the characteristic value p as compared in the conventional method.

For instance, we will describe calculation of Equation (11) with the effective channel length Leff, the threshold voltage Vth, and the external terminal RSH as a parameter x. At this time, the characteristic value p is a constant; and the vector x is a vector with three rows and one column, having the parameters Leff, Vth, and RSH as its elements. In this case, Equation (11) can be rewritten as follows:

$$x_w = \begin{bmatrix} \mu_{Leff} \\ \mu_{Vth} \\ \mu_{RSH} \end{bmatrix} + \begin{bmatrix} S^2_{Leff} & S_{Leff,Vth} & S_{Leff,RSH} \\ S_{Vth,Leff} & S^2_{Vth} & S_{Vth,RSH} \\ S_{RSH,Leff} & S_{RSH,Vth} & S^2_{RSH} \end{bmatrix}^{-1} \begin{bmatrix} \frac{\partial P}{\partial Leff} \\ \frac{\partial P}{\partial Vth} \\ \frac{\partial P}{\partial RSH} \end{bmatrix} \frac{1}{S^2_P}(P - \mu_p)$$

Alternatively, when the vector p is a vector with two rows and one column, having characteristic values p1 and p2 as its elements; and the vector x is a vector with three rows and one column, having the parameters Leff, Vth, and RSH as its elements, Equation (11) can be rewritten as follows:

$$x_w = \begin{bmatrix} \mu_{Leff} \\ \mu_{Vth} \\ \mu_{RSH} \end{bmatrix} + \begin{bmatrix} S^2_{Leff} & S_{Leff,Vth} & S_{Leff,RSH} \\ S_{Vth,Leff} & S^2_{Vth} & S_{Vth,RSH} \\ S_{RSH,Leff} & S_{RSH,Vth} & S^2_{RSH} \end{bmatrix}^{-1} \begin{bmatrix} \frac{\partial P1}{\partial X1} & \frac{\partial P2}{\partial X1} \\ \frac{\partial P1}{\partial X2} & \frac{\partial P2}{\partial X2} \\ \frac{\partial P1}{\partial X3} & \frac{\partial P2}{\partial X3} \end{bmatrix} \begin{bmatrix} S^2_{P1} & S_{P1,P2} \\ S_{P1,P2} & S^2_{P2} \end{bmatrix} \begin{bmatrix} P1 - \mu_{P1} \\ P2 - \mu_{P2} \end{bmatrix}$$

The characteristic variation evaluation unit of the seventh preferred embodiment in FIG. 11 is different from those of the first to fourth preferred embodiments in FIG. 5 only in the function of the worst-case parameter generation unit 20. The other part of the structure is identical with that of the first to fourth preferred embodiments. The worst-case parameter generation unit 20 of the seventh preferred embodiment has a function to perform the processing of step ST21 illustrated in FIG. 12.

8. Eighth Preferred Embodiment

Characteristic variation evaluation method and unit of semiconductor devices according to an eighth preferred embodiment of the present invention are obtained with improvements in the step or means of generating the worst-case parameter of the conventional basic method. That is, step ST12 of the conventional method in FIG. 24 is substituted by step ST80 as shown in FIG. 12.

In the conventional method, the worst-case parameter $x_w$ is generated from Equation (7). In the method of the eighth preferred embodiment, on the other hand, the worst-case parameter $x_w$ is found by:

$$x_w = \mu_x + (B^t)^+ \delta_p \qquad (12)$$

where p is a characteristic value corresponding to the worst case; and $(B^t)^+$ is the generalized inverse matrix of $B^t$. The use of Equation (12) for the generation of the worst-case parameter $x_w$ increases accuracy in the calculation of the variations of the characteristic value p.

For instance, we will describe calculation of Equation (12) with the effective channel length Leff, the threshold voltage Vth, and the external terminal RSH as the parameters x. At this time, the vector p is a vector with two rows and one column, having characteristic values p1 and p2 as its elements; and the vector x is a vector with three rows and one column, having the parameters Leff, Vth, and RSH as its elements. In this case, Equation (12) can be rewritten as follows:

$$x_W = \begin{bmatrix} \mu_{Leff} \\ \mu_{Vth} \\ \mu_{RSH} \end{bmatrix} + \begin{bmatrix} \frac{\partial x1}{\partial P1} & \frac{\partial x1}{\partial P2} \\ \frac{\partial x2}{\partial P1} & \frac{\partial x2}{\partial P2} \\ \frac{\partial x3}{\partial P1} & \frac{\partial x3}{\partial P2} \end{bmatrix} \begin{bmatrix} P1 - \mu_{P1} \\ P2 - \mu_{P2} \end{bmatrix}$$

The characteristic variation evaluation unit of semiconductor devices according to the eighth preferred embodiment is as shown in FIG. 11. It is different from the units of the first to fourth preferred embodiments in FIG. 5 only in the function of the worst-case parameter generation unit 20. The other part of the structure is identical with that of the first to fourth preferred embodiments. The worst-case parameter generation unit 20 of the eighth preferred embodiment has a function to perform the processing of step ST21 illustrated in FIG. 12.

9. Ninth Preferred Embodiment

Characteristic variation evaluation method and unit of semiconductor devices according to a ninth preferred embodiment of the present invention are obtained with improvements in the step or means of generating the worst-case parameter of the conventional basic method. That is, step ST12 of the conventional method in FIG. 24 is substituted by step ST80 as shown in FIG. 12.

In the method of the ninth preferred embodiment, the worst-case parameter $x_w$ is found by:

$$x_w = \mu_x + B_{Table} \Sigma_x \qquad (13)$$

More specifically, the characteristic variation evaluation method and unit of the ninth preferred embodiment makes an table of a correlation between the worst-case parameter calculated from Equation (7), (11), or (12) and the standard deviation of each parameter. Table 1 shows an example of $B_{Table}$ in Equation (13).

TABLE 1

| NMOS | | | PMOS | | | NMOS | | PMOS | | |
|---|---|---|---|---|---|---|---|---|---|---|
| Leff/$\sigma_{Leff}$ | RSH/$\sigma_{RSH}$ | Vth/$\sigma_{Vth}$ | Leff/$\sigma_{Leff}$ | RSH/$\sigma_{RSH}$ | Vth/$\sigma_{Vth}$ | Cj/$\sigma_{Cj}$ | Cjsw/$\sigma_{Cjsw}$ | Cj/$\sigma_{Cj}$ | Cjsw/$\sigma_{Cjsw}$ | Tpd/$\sigma_{Tpd}$ |
| 0.59 | 0.17 | 0.57 | 0.95 | 0.51 | 0.19 | 0.80 | 0.49 | 0.026 | 0.22 | 1 |
| 1.17 | 0.35 | 1.13 | 1.89 | 1.01 | 0.38 | 1.60 | 0.98 | 0.052 | 0.45 | 2 |
| 1.76 | 0.52 | 1.70 | 2.84 | 1.52 | 0.57 | 2.40 | 1.47 | 0.078 | 0.67 | 3 |

The use of Equation (13) and Table 1 makes it possible to calculate the worst-case parameter only from the mean values and the standard deviations.

The characteristic variation evaluation unit of semiconductor devices according to the ninth preferred embodiment is as shown in FIG. 11. It is different from the units of the first to fourth preferred embodiments in FIG. 5 only in the function of the worst-case parameter generation unit 20. The other part of the structure is identical with that of the first to fourth preferred embodiments. The worst-case parameter generation unit 20 of the ninth preferred embodiment has a function to perform the processing of step ST21 illustrated in FIG. 12.

The flow charts of the aforementioned first to ninth preferred embodiments of the present invention are implemented by having a computer execute a program stored in a storage unit thereof, but it is also possible to have a computer load and execute a program stored in a recording medium such as a flexible disc via a flexible disc driver. Further, the program stored in the recording medium may be a program for having a computer execute not the whole but part of the flow charts. This is because the flow chart can be implemented by linking that program with a program already loaded in a computer. Further, a program for achieving the characteristic variation evaluation method of semiconductor devices may include step ST1 of extracting data in FIG. 1 so as to have a computer control a measuring device, or it may not include step ST1 by using already-measured/extracted data.

While the invention has been described in detail, the foregoing description is in all aspects illustrative and not restrictive. It is understood that numerous other modifications and variations can be devised without departing from the scope of the invention.

What is claimed is:

1. A characteristic variation evaluation method of semiconductor devices, comprising the steps of:
   (a) extracting predetermined parameters concerning a characteristic vale of semiconductor devices and measuring said characteristic value to obtain a measured characteristic value;
   (b) eliminating outliers from data measured at said step (a);
   (c) selecting a typical semiconductor device having data that is typical among said data with outliers eliminated therefrom, from semiconductor devices used for the measurement of said step (a), and extracting said predetermined parameters of said typical semiconductor device as typical parameters;
   (d) selecting specific parameters to be used for the generation of a worst-case parameter, from said predetermined parameters;
   (e) generating a worst-case parameter from said specific parameters on the basis of said data with outliers eliminated therefrom; and
   (f) verifying a worst-case parameter on the basis of said characteristic value calculated from said typical parameters excepting said specific parameters and said worst-case parameter generated at said step (e),
   said step (d) including the steps of:
   (d-1) extracting equations setting plural combinations of said predetermined parameters,
   (d-2) inserting parameter values extracted from the semiconductor devices used for the measurement of step (a) into the equations obtained in step (d-1) to obtain a calculated characteristic value;
   (d-3) obtaining a correlation coefficient between the measured characteristic value and the calculated characteristic value for each parameter combination in the equations obtained in step (d-1);
   (d-4) selecting said specific parameters based on said correlation coefficient.

2. A characteristic variation evaluation method of semiconductor devices, comprising the steps of:
   (a) extracting predetermined parameters concerning a characteristic value of semiconductor devices and measuring said characteristic value;
   (b) eliminating outliers from data measured at said step (a);
   (c) selecting a typical semiconductor device having data that is typical among said data with outliers eliminated therefrom, from semiconductor devices used for the measurement of said step (a), and extracting said predetermined parameters of said typical semiconductor device as typical parameters;
   (d) selecting specific parameters to be used for the generation of a worst-case parameter, from said predetermined parameters;
   (e) generating a worst-case parameter from said specific parameters on the basis of said data with outliers eliminated therefrom; and
   (f) verifying a worst-case parameter on the basis of said characteristic value calculated from said typical parameters excepting said specific parameters and said worst-case parameter generated at said step (e),
   said step (d) including the steps of:
   (d-1) obtaining a coefficient concerning said specific parameters; and
   (d-2) selecting said specific parameters on the basis of said coefficient wherein said step (d-1) includes the steps of:
   determining an equation that expresses said characteristic value by some of said predetermined parameters; and
   obtaining a correlation coefficient between said characteristic value measured at said step (a) and a characteristic value calculated from said equation, as said coefficient.

3. The characteristic variation evaluation method of semiconductor devices, comprising the steps of:

(a) extracting predetermined parameters concerning a characteristic value of semiconductor devices and measuring said characteristic value;

(b) eliminating outliers from data measured at said step (a);

(c) selecting a typical semiconductor device having data that is typical among said data with outliers eliminated therefrom, from semiconductor devices used for the measurement of said step (a), and extracting said predetermined parameters of said typical semiconductor device as typical parameters;

(d) selecting specific parameters to be used for the generation of a worst-case parameter, from said predetermined parameters;

(e) generating a worst-case parameter from said specific parameters on the basis of said data with outliers eliminated therefrom; and (f) verifying a worst-case parameter on the basis of said characteristic value calculated from said typical parameters excepting said specific parameters and said worst-case parameter generated at said step (e), said step (d) including the steps of:

(d-1) obtaining a coefficient concerning said specific parameters; and (d-2) selecting said specific parameters on the basis of said coefficient wherein said step (d-1) includes the steps of:

obtaining sensitivity from some of said predetermined parameters; and obtaining respective inner products of said sensitivity and said some of said predetermined parameters to obtain respective correlation coefficients between said characteristic value measured at said step (a) and said inner products, as said coefficient.

4. The characteristic variation evaluation method of semiconductor devices, comprising the steps of:

(a) extracting predetermined parameters concerning a characteristic value of semiconductor devices and measuring said characteristic value;

(b) eliminating outliers from data measured at said step (a);

(c) selecting a typical semiconductor device having data that is typical among said data with outliers eliminated therefrom, from semiconductor devices used for the measurement of said step (a), and extracting said predetermined parameters of said typical semiconductor device as typical parameters;

(d) selecting specific parameters to be used for the generation of a worst-case parameter, from said predetermined parameters;

(e) generating a worst-case parameter from said specific parameters on the basis of said data with outliers eliminated therefrom; and (f) verifying a worst-case parameter on the basis of said characteristic value calculated from said typical parameters excepting said specific parameters and said worst-case parameter generated at said step (e), said step (d) including the steps of:

(d-1) obtaining a coefficient concerning said specific parameters; and (d-2) selecting said specific parameters on the basis of said coefficient wherein said step (d-1) includes the steps of:

obtaining sensitivity from some of said predetermined parameters; and obtaining respective standard partial regression coefficients of said some of said predetermined parameters from said sensitivity, as said coefficient.

5. The characteristic variation evaluation method of semiconductor devices, comprising the steps of:

(a) extracting predetermined parameters concerning a characteristic value of semiconductor devices and measuring said characteristic value;

(b) eliminating outliers from data measured at said step (a);

(c) selecting a typical semiconductor device having data that is typical among said data with outliers eliminated therefrom, from semiconductor devices used for the measurement of said step (a), and extracting said predetermined parameters of said typical semiconductor device as typical parameters;

(d) selecting specific parameters to be used for the generation of a worst-case parameter, from said predetermined parameters;

(e) generating a worst-case parameter from said specific parameters on the basis of said data with outliers eliminated therefrom; and (f) verifying a worst-case parameter on the basis of said characteristic value calculated from said typical parameters excepting said specific parameters and said worst-case parameter generated at said step (e), said step (d) including the steps of:

(d-1) obtaining a coefficient concerning said specific parameters; and (d-2) selecting said specific parameters on the basis of said coefficient wherein said step (d-1) includes the step of:

obtaining respective random coefficients of some of said predetermined parameters, as said coefficient.

6. A characteristic variation evaluation method of semiconductor devices, comprising the steps of:

(a) extracting predetermined parameters concerning a characteristic value of semiconductor devices and at the same time measuring said characteristic value;

(b) eliminating outliers from data measured at said step (a);

(c) selecting a typical semiconductor device having data that is typical among said data with outliers eliminated therefrom, from semiconductor devices used for the measurement of said step (a), and extracting said predetermined parameters of said typical semiconductor device as typical parameters;

(d) selecting specific parameters to be used for the generation of a worst-case parameter from said predetermined parameters;

(e) generating a worst-case parameter from said specific parameters on the basis of said data with outliers eliminated therefrom; and (f) verifying a worst-case parameter on the basis of said characteristic value calculated from said typical parameters excepting said specific parameters and said worst-case parameter generated at said step (e), said step (e) including the steps of:

calculating sensitivity, on the basis of said data with outliers eliminated therefrom, from a relation as follows:

$$B = \Sigma_x^{-1}(x-\mu_x)/(p-\mu_p)^t \Sigma_p$$

where
- B is a sensitivity vector or matrix,
- x is a parameter vector or matrix,
- p is a characteristic-value vector or matrix,
- $\mu_x$ and $\mu_p$ are mean vectors or matrices of x and p, respectively,
- $\Sigma_x$ and $\Sigma_p$ are variance-covariance matrices of x and p, respectively,
- −1 indicates an inverse matrix, and
- t is a transposed matrix; and calculating a worst-case parameter from said sensitivity.

7. A characteristic variation evaluation method of semiconductor devices, comprising the steps of:

(a) extracting predetermined parameters concerning a characteristic value of semiconductor devices and at the same time measuring said characteristic value;

(b) eliminating outliers from data measured at said step (a);

(c) selecting a typical semiconductor device having data that is typical among said data with outliers eliminated therefrom, from semiconductor devices used for the measurement of said step (a), and extracting said predetermined parameters of said typical semiconductor device as typical parameters;

(d) selecting specific parameters to be used for the generation of a worst-case parameter, from said predetermined parameters;

(e) generating a worst-case parameter from said specific parameters on the basis of said data with outliers eliminated therefrom; and (f) verifying a worst-case parameter on the basis of said characteristic value calculated from said typical parameters excepting said specific parameters and said worst-case parameter generated at said step (e), said step (e) including the steps of:

preparing a table showing a correlation between said sensitivity and said specific parameters; and calculating a worst-case parameter, using said table, from a relation as follows:

$$x_w = \mu_x + B_{Table} \Sigma_x$$

where
- $x_w$ is a worst-case parameter vector or matrix;
- $\mu_x$ is a mean vector or matrix of the parameter x;
- $B_{Table}$ is a sensitivity vector or matrix; and
- $\Sigma_x$ is a variance vector or matrix.

* * * * *